United States Patent
Krames et al.

(10) Patent No.: US 6,525,335 B1
(45) Date of Patent: Feb. 25, 2003

(54) LIGHT EMITTING SEMICONDUCTOR DEVICES INCLUDING WAFER BONDED HETEROSTRUCTURES

(75) Inventors: Michael R. Krames, Mountain View, CA (US); Christopher P. Kocot, Palo Alto, CA (US)

(73) Assignee: Lumileds Lighting, U.S., LLC, San Jose, CA (US)

( * ) Notice: Subject to any disclaimer, the term of this patent is extended or adjusted under 35 U.S.C. 154(b) by 28 days.

(21) Appl. No.: 09/707,495

(22) Filed: Nov. 6, 2000

(51) Int. Cl.$^7$ ............................................. H01L 29/06

(52) U.S. Cl. ........................... 257/13; 257/77; 257/190; 257/94; 257/96; 257/103

(58) Field of Search ........................... 257/13, 190, 76, 257/77, 79, 94, 103, 96, 97; 438/406, 455

(56) References Cited

U.S. PATENT DOCUMENTS

| | | |
|---|---|---|
| 3,239,908 A | 3/1966 | Nakamura |
| 3,351,502 A | 11/1967 | Rediker |
| 3,355,636 A | 11/1967 | Becke et al. |
| 3,959,045 A | 5/1976 | Antypas ......................... 156/3 |
| 4,169,000 A | 9/1979 | Riseman ..................... 145/187 |
| 4,317,091 A | 2/1982 | Dahlberg .................... 331/107 |
| 4,451,843 A | 5/1984 | Dahlberg ..................... 357/36 |
| 4,638,552 A | 1/1987 | Shimbo et al. ............. 29/576 J |
| 4,738,935 A | 4/1988 | Shimbl et al. ................ 437/31 |
| 4,883,215 A | 11/1989 | Goessele et al. ............ 228/116 |
| 4,914,667 A * | 4/1990 | Blonder et al. ............... 273/44 |
| 5,008,718 A * | 4/1991 | Fletcher et al. ............... 357/17 |
| 5,376,580 A | 12/1994 | Kish et al. ................... 437/127 |
| 5,502,316 A | 3/1996 | Kish et al. ..................... 257/94 |
| 5,661,316 A | 8/1997 | Kish et al. ................... 257/190 |
| 5,869,849 A | 2/1999 | Jou et al. ....................... 257/96 |
| 5,917,202 A * | 6/1999 | Haitz et al. .................... 257/98 |
| 6,282,220 B1 * | 8/2001 | Floyd ............................ 372/50 |
| 6,355,541 B1 * | 3/2002 | Holland et al. ............. 438/459 |
| 6,420,199 B1 * | 7/2002 | Coman et al. ................ 438/22 |

OTHER PUBLICATIONS

J. K, Sheu et al., "Investigation of Wafer–Bonded $(Al_xGa_{I-x})_{.50}In_{0.5}P$/GaP Light–Emitting Diodes", IEE Proceedings: Optoelectronics Institution of Electrical Engineers, vol. 145, No. 4, Aug. 18, 1998, pp. 248–252.

Patent Abstracts of Japan, Publication No. 61182280, Publication Date Aug. 14, 1986.

Winston K. Chan, Alfredo Yi–Yan, and Thomas J. Gmitter, "Grafted Semiconductor Optoelectronics", IEEE Journal of Quantum Electronics, vol. 27, No. 3, Mar. 1991, pp. 717–725.

P. D. Floyd, C. L. Chua, D. W. Treat, and D. P. Bour, "Wafer Fusion of Infrared Laser Diodes to GaN Light–Emitting Heterostructures", IEEE Photonics Technology Letters, vol. 10, No. 11, Nov. 1998, pp. 1539–1541.

(List continued on next page.)

*Primary Examiner*—Sara Crane
(74) *Attorney, Agent, or Firm*—Patent Law Group LLP

(57) ABSTRACT

A method of forming a light emitting semiconductor device includes fabricating a stack of layers comprising an active region, and wafer bonding a structure including a carrier confinement semiconductor layer to the stack. A light emitting semiconductor device includes a first carrier confinement layer of a first semiconductor having a first conductivity type, an active region, and a wafer bonded interface disposed between the active region and the first carrier confinement layer. The light emitting semiconductor device may further include a second carrier confinement layer of a second semiconductor having a second conductivity type, with the active region disposed between the first carrier confinement layer and the second carrier confinement layer. The wafer bonded confinement layer provides enhanced carrier confinement and device performance.

31 Claims, 13 Drawing Sheets

OTHER PUBLICATIONS

J. J. Dudley, D. I. Babic, R. Mirin, L. Yang, B. I. Miller, R. J. Ram, T. Reynolds, E. L. Hu, and J. E. Bowers, "Low Threshold, Wafer Fused Long Wavelength Vertical Cavity Lasers", Appl. Phys. Lett., vol. 64, No. 12, Mar. 21, 1994, pp. 1463–1465.

J. J. Dudley, M. Ishikawa, D. I. Babic, B. I. Miller, R. Mirin, W. B. Jian, J. E. Bowers, and E. L. Hu, "144 °C Operation of 1.3 $\mu$m InGaAsP Vertical Cavity Laser on GaAs Substrates", Appl. Phys. Lett., vol. 61, No. 26, Dec. 28, 1992, pp. 3095–3097.

Dubravko I. Babic, , Klaus Streubel, Richard P. Mirin, Near M. Margalit, John E. Bowers, Evelyn L. Hu, Dan E. Mars, Long Yang, and Kent Carey, "Room–Temperature Continuous–Wave Operation of 1.54–$\mu$m Vertical–Cavity Lasers", IEEE Photonics Technology Letters, vol. 7, No. 11, Nov. 1995, pp. 1225–1227.

C. L. Chua, C. H. Lin, Z. H. Zhu, Y. H. Lo, M. Hong, J. P. Mannaerts, and R. Bhat, "Dielectrically–bonded Long Wavelength Vertical Cavity Laser on GaAs Substrates Using Strain–Compensated Multiple Quantum Wells", IEEE Photonics Technology Letters, Vo. 6, No. 12, Dec. 1994, pp. 1400–1402.

R. K, Sink, S. Keller, B. P. Keller, D. I. Babic, A. L. Holmes, D. Kapolnek, S. P. DenBaars, and J. E. Bowers, "Cleaved GaN Facets by Wafer Fusion of GaN to InP", Apply. Phys. Lett. vol. 68, No. 15, Apr. 8, 1996, pp. 2147–2149.

* cited by examiner

LIGHT EMITTING SEMICONDUCTOR DEVICES INCLUDING WAFER BONDED HETEROSTRUCTURES

BACKGROUND OF THE INVENTION

1. Field of the Invention

The invention relates generally to light emitting semiconductor devices and more particularly to light emitting semiconductor devices including carrier confinement layers.

2. Description of the Related Art

A conventional $Al_xGa_yIn_zP$ light emitting diode (LED) 1, as shown in FIG. 1, includes an n-doped semiconductor substrate 2, an n-doped confinement layer 4, an active region 6, a p-doped confinement layer 8, an optional electrically conductive window layer 10, n-contact 12 electrically coupled to substrate 2, and p-contact 14 electrically coupled to p-doped confinement layer 8. In the notation $Al_xGa_yIn_zP$, $0 \leq x \leq 1$, $0 \leq y \leq 1$, $0 \leq z \leq 1$, and $x+y+z=1$. Application of a suitable forward bias across contacts 12 and 14 results in injection of electrons into active region 6 from n-doped confinement layer 4, and injection of holes into active region 6 from p-doped confinement layer 8. Radiative recombination of electrons and holes in active region 12 generates light.

As used herein, the terms "p-type confinement layer" and "electron confinement layer" refer to a semiconductor layer which at least partially confines electrons to an active region in a semiconductor heterostructure. Similarly, the terms "n-type confinement layer" and "hole confinement layer" refer herein to a semiconductor layer which at least partially confines holes to an active region in a semiconductor heterostructure.

FIG. 2 shows a conventionally calculated band structure diagram for the heterostructure defined by active region 6 and confinement layers 4 and 8 of the conventional $Al_xGa_yIn_zP$ LED 1 shown in FIG. 1. The horizontal axis of FIG. 2 represents position in LED 1 measured perpendicular to active region 6 and confinement layers 4 and 8, with the location of zero distance arbitrarily chosen. In the example of FIG. 2, n-type confinement layer 4 is formed from n-type AlInP, p-type confinement layer 8 is formed from p-type AlInP, and active region 6 is formed from $(Al_{0.3}Ga_{0.7})_{0.5}In_{0.5}P$. The interfaces between confinement layer 4 and active region 6 and between active region 6 and confinement layer 8 are indicated by dashed lines 16 and 18, respectively. The vertical axis of FIG. 2 represents the energy of the conduction band edge 20 and of the valence band edge 22 when confinement layers 4 and 8 and active region 6 are forward biased at about 2.1 volts. The location of zero energy on the vertical axis is arbitrarily chosen.

The energies of both the conduction band edge 20 and the valence band edge 22 vary with position in the LED. In particular, the energy of conduction band edge 20 is higher in p-type confinement layer 8 than in active region 6, resulting in a potential energy barrier (electron barrier 24) in conduction band edge 20 at interface 18. Since only a fraction of the electrons injected into active region 6 can overcome electron barrier 24 and diffuse into p-type confinement layer 8, the injected electrons are partially confined to active region 6 by electron barrier 24. Consequently, the concentration of electrons in active region 6 is increased by the presence of p-type confinement layer 8, which is also referred to as an electron confinement layer. Similarly, the energy of valence band edge 22 is higher in active region 6 than in n-type confinement layer 4, resulting in a potential energy barrier (hole barrier 26) at interface 16 which partially confines injected holes to active region 6.

Confinement of electrons and holes to active region 6 increases their concentration in active region 6 and thus the rate at which they radiatively recombine. Also, electrons and holes which escape from active region 6 typically recombine nonradiatively in confinement layers 4 and 8. Thus, the internal quantum efficiency of the LED depends strongly on the degree to which electrons and holes are confined to active region 6.

In a conventional $Al_xGa_yIn_zP$ LED, n-type confinement layer 4, active region 6, and p-type confinement layer 8 are grown by, for example, metal-organic chemical vapor deposition (MOCVD). The choice of materials from which confinement layers 4 and 8 may be grown is limited by the requirement that these layers must be grown lattice matched to active region 6 to provide confinement layers with low dislocation densities. In addition, confinement layers 4 and 8 must be grown at temperatures that will not degrade underlying layers. The best electron confinement layers that can be grown lattice matched to an $Al_xGa_yIn_zP$ active region 6 are $(Al_xGa_{1-x})_{0.5}In_{0.5}P$ layers with x ranging from about 0.7 to about 1.

Unfortunately, electron leakage from active region 6 into p-type confinement layer 8 can severely limit the internal quantum efficiency of a conventional $Al_xGa_yIn_zP$ LED. Such electron leakage occurs due to the relatively small offset between the conduction band in the $Al_xGa_yIn_zP$ system active region and the conduction band in, for example, a p-$(Al_xGa_{1-x})_{0.5}In_{0.5}P$ electron confinement layer (x about 0.7 to about 1). In conventional LED 1 of FIG. 1, for example, the relatively small offset between the conduction band in the $(Al_{0.3}Ga_{0.7})_{0.5}In_{0.5}P$ active region 6 and the conduction band in the p-AlInP electron confinement layer 8 results in a correspondingly small electron barrier 24 of about 0.2 electron volts (eV) over which electrons escape by thermionic emission. Moreover, as the mole fraction of aluminum in active region 6 is increased to provide shorter wavelength emission, electron barrier 24 decreases and electron leakage correspondingly increases. Consequently, the internal quantum efficiency of a conventional $Al_xGa_yIn_zP$ LED is undesirably low, particularly at short emission wavelengths and especially at temperatures greater than about 25° C.

Similarly, leakage of holes from active region 6 over hole barrier 26 into n-type confinement layer 4 can degrade the performance of a conventional $Al_xGa_yIn_zP$ LED, particularly if it has a thin active region 6 or if it is operated at a high injection current.

What is needed is a light emitting semiconductor device exhibiting enhanced carrier confinement.

SUMMARY

A method of forming a light emitting semiconductor device includes fabricating a stack of layers comprising an active region, and wafer bonding a structure including a carrier confinement semiconductor layer to the stack. In one embodiment, the carrier confinement layer is wafer bonded to the active region. In other embodiments, at least one spacer layer is disposed between the carrier confinement layer and the active region.

According to one aspect of the present invention, a light emitting semiconductor device includes a first carrier confinement layer of a first semiconductor having a first conductivity type, an active region, and a wafer bonded interface disposed between the active region and the first carrier confinement layer. The light emitting semiconductor device may further include a second carrier confinement layer of a second semiconductor having a second conductivity type, with the active region disposed between the first carrier confinement layer and the second carrier confinement layer. The active region may be formed from materials including but not limited to $(Al_xGa_{1-x})_{0.5}In_{0.5}P$ and other $Al_xGa_yIn_zP$.

In one implementation, the wafer bonded interface is an interface of the active region and the first carrier confinement layer. In other implementations, at least one spacer layer is disposed between the first carrier confinement layer and the active region, and the wafer bonded interface is an interface of a spacer layer and the first carrier confinement layer, an interface of a spacer layer and the active region, or an interface of two spacer layers. The first carrier confinement layer may include a p-type or n-type semiconductor comprising a semiconductor selected from the group including but not limited to SiC, AlP, AlN, GaN, II–VI semiconductors, and diamond. Spacer layers may include a p-type, n-type, or undoped semiconductor comprising a semiconductor selected from the group including but not limited to InGaP, AlInP, $(Al_xGa_{1-x})_{0.5}In_{0.5}P$, and other $Al_xGa_yIn_zP$.

According to another aspect of the present invention, a light emitting semiconductor device includes a first semiconductor layer of p-type conductivity, a second semiconductor layer of n-type conductivity, an active region disposed between the first semiconductor layer and the second semiconductor layer, and a wafer bonded interface disposed between the active region and either the first semiconductor layer or the second semiconductor layer. The conduction band edge of the first semiconductor layer is of higher energy than the conduction band edge of the active region, and the valence band edge of the second semiconductor layer is of lower energy than the valence band edge of the active region. The active region may formed from materials as listed above. The first and second semiconductor layers may include but are not limited to, respectively, p-type and n-type semiconductors listed above as suitable for the first carrier confinement layer.

Light emitting semiconductor devices in accordance with embodiments of the present invention can exhibit enhanced confinement of electrons and holes to the active region. This enhanced confinement provides improved internal quantum efficiency and temperature dependence, and allows optimization of, for example, the thickness of the active region to further improve device performance.

DETAILED DESCRIPTION

Figure 3A:
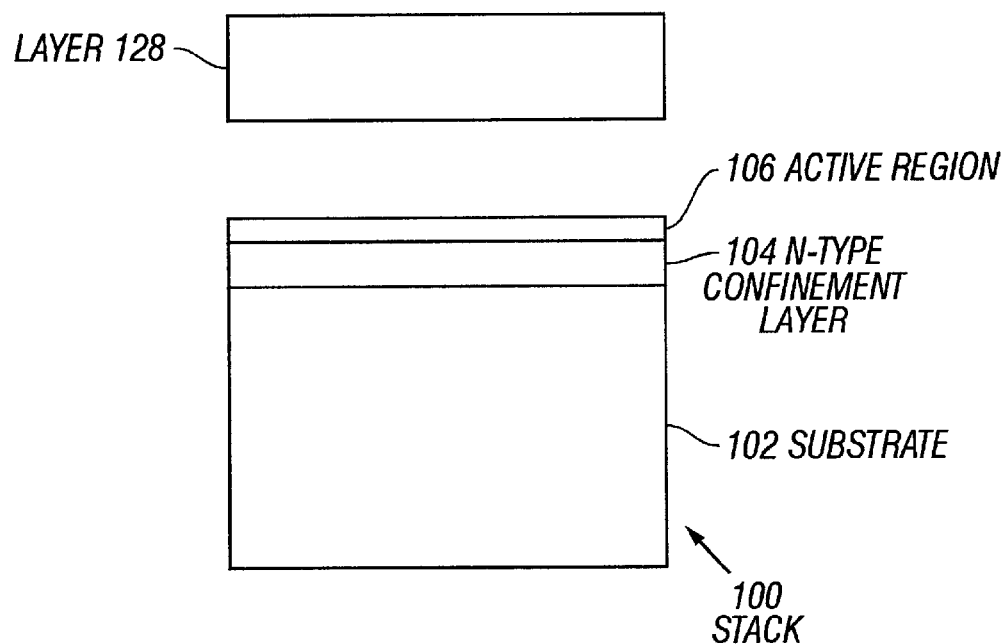
FIG. 3A is a schematic diagram of a layer and a stack to be wafer bonded to each other in accordance with an embodiment of the present invention.

Referring to FIG. 3A, in accordance with an embodiment of the present invention, a semiconductor layer 128 is to be wafer bonded to a stack 100 to form an electron confinement layer in a heterostructure suitable for use in a light emitting semiconductor device. Semiconductor layer 128 is, in one implementation, a layer of p-type SiC. In the example of FIG. 3A, stack 100 includes substrate 102, n-type confinement layer 104, and active region 106. Substrate 102 is, for example, an n-type GaAs substrate. In one implementation, n-type confinement layer 104 is a layer of AlInP about 0.5 to about 2.0 µm thick grown on and lattice matched to substrate 102 by metal-organic chemical vapor deposition (MOCVD) or molecular beam epitaxy (MBE). Active region 106 includes, for example, one or more layers of $(Al_xGa_{1-x})_{0.5}In_{0.5}P$ grown on and lattice matched to n-type confinement layer 104 by MOCVD. In one implementation, the total thickness of active region 106 is about 0.005 μm to about 0.75 μm. Layer 128 is wafer bonded to stack 100 by placing layer 128 in contact with active region 106, raising the temperature of layer 128 and stack 100, and pressing layer 128 and stack 100 together. Preferably, the temperature of layer 128 and stack 100 is raised to a temperature less than about 1000° C., in order to avoid damaging active region 106 and n-type confinement layer 104. The process of wafer bonding layer 128 to stack 100 may be performed, for example, with devices disclosed in U.S. Pat. No. 5,502,316 and 5,376,580, incorporated herein by reference in their entirety, previously used to bond, for example, a GaP substrate to an $(Al_xGa_{1-x})_{0.5}In_{0.5}P$ LED.

Figure 3B:
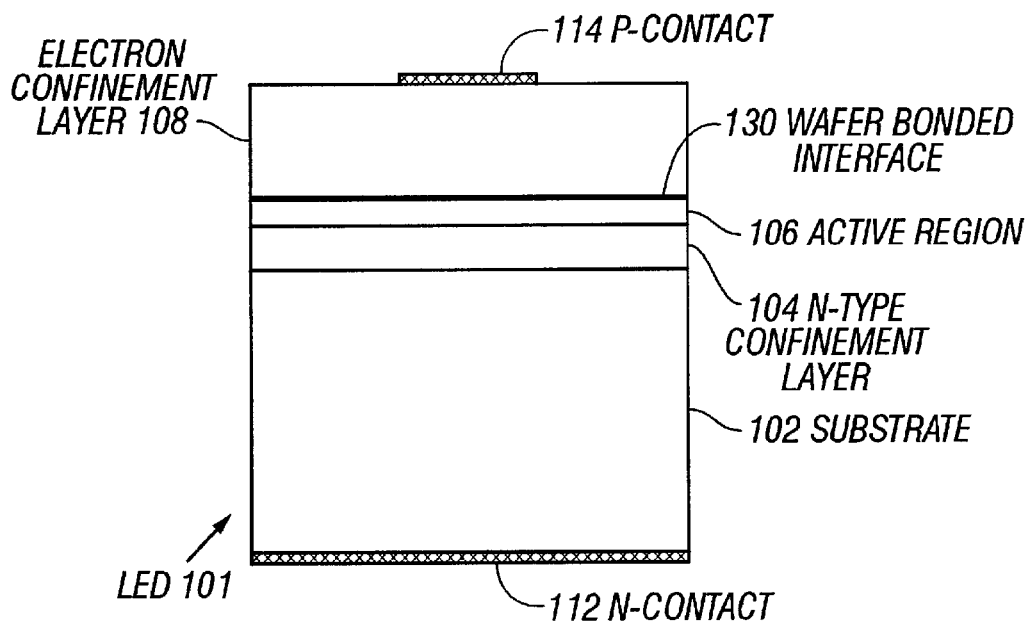
FIG. 3B is a schematic diagram of a light emitting diode including a wafer bonded electron confinement layer in accordance with an embodiment of the present invention.

Referring to FIG. 3B, an LED 101 in accordance with one embodiment of the present invention includes substrate 102, n-type confinement layer 104, and active region 106 as described above with reference to FIG. 3A. (Like reference numbers in the various figures designate same parts in the various embodiments.) LED 101 also includes electron confinement layer 108 formed by wafer bonding layer 128, described above, to active region 106 at wafer bonded interface 130. N-contact 112 and p-contact 114 are electrically coupled to substrate 102 and electron confinement layer 108, respectively. Active region 106 emits light upon application of a suitable forward bias across contacts 112 and 114. One of ordinary skill in the art will recognize that wafer bonded interface 130 between active region 106 and electron confinement layer 108 can be distinguished from an interface between one layer grown on another layer, such as the interface between active region 6 and p-type confinement layer 8 in FIG. 1, by, for example, the nature and quantity of the dislocations at and near wafer bonded interface 130.

In one implementation, electron confinement layer 108 and thus layer 128 are preferably greater than about 50 μm thick, more preferably greater than about 200 μm thick, in order to ease handling of layer 128 and to facilitate formation of a low resistance electrical contact between electron confinement layer 108 and p-contact 114. In other implementations, electron confinement layer 108, and thus layer 128, can be as thin as about 500 Angstroms (Å). In one implementation, layer 128 is initially thicker than a desired thickness of electron confinement layer 108, and is thinned to the desired thickness after being wafer bonded to stack 100. Semiconductor layer 128 may be, for example, a wafer or block of semiconductor material, or a semiconductor layer on a stack of layers, such as an epitaxially grown semiconductor layer on a substrate. Semiconductor layer 128 may include a plurality of layers.

Although FIGS. 3A and 3B illustrate particular structures for stack 100 and LED 101, light emitting diodes in accordance with the present invention may include more or fewer layers than shown in stack 100 and LED 101. For example, confinement layers 104 and 108 may each include a plurality of layers. Also, in one embodiment substrate 102 is not provided and n-contact 112 is disposed directly on n-type confinement layer 104. In other implementations substrate 102 is formed from a material other than GaAs. For example, in one implementation n-type confinement layer 104 and active layer 106 are grown lattice matched to a GaAs sacrificial substrate, which is subsequently removed and replaced by a GaP substrate 102 wafer bonded to n-type confinement layer 104. In another implementation, substrate 102 is not conducting, and n-contact 112 is disposed on a portion of n-type confining layer 104. In another implementation, substrate 102 is substantially transparent to light emitted by active region 106. N-type confinement layer 104 may be formed, for example, from materials including but not limited to $(Al_xGa_{1-x})_{0.5}In_{0.5}P$ having an aluminum mole fraction x greater than that of the material from which active region 106 is formed.

It should also be noted that dimensions of the various elements of stack 100 and LED 101 illustrated in the various figures are not to scale.

Figure 4:
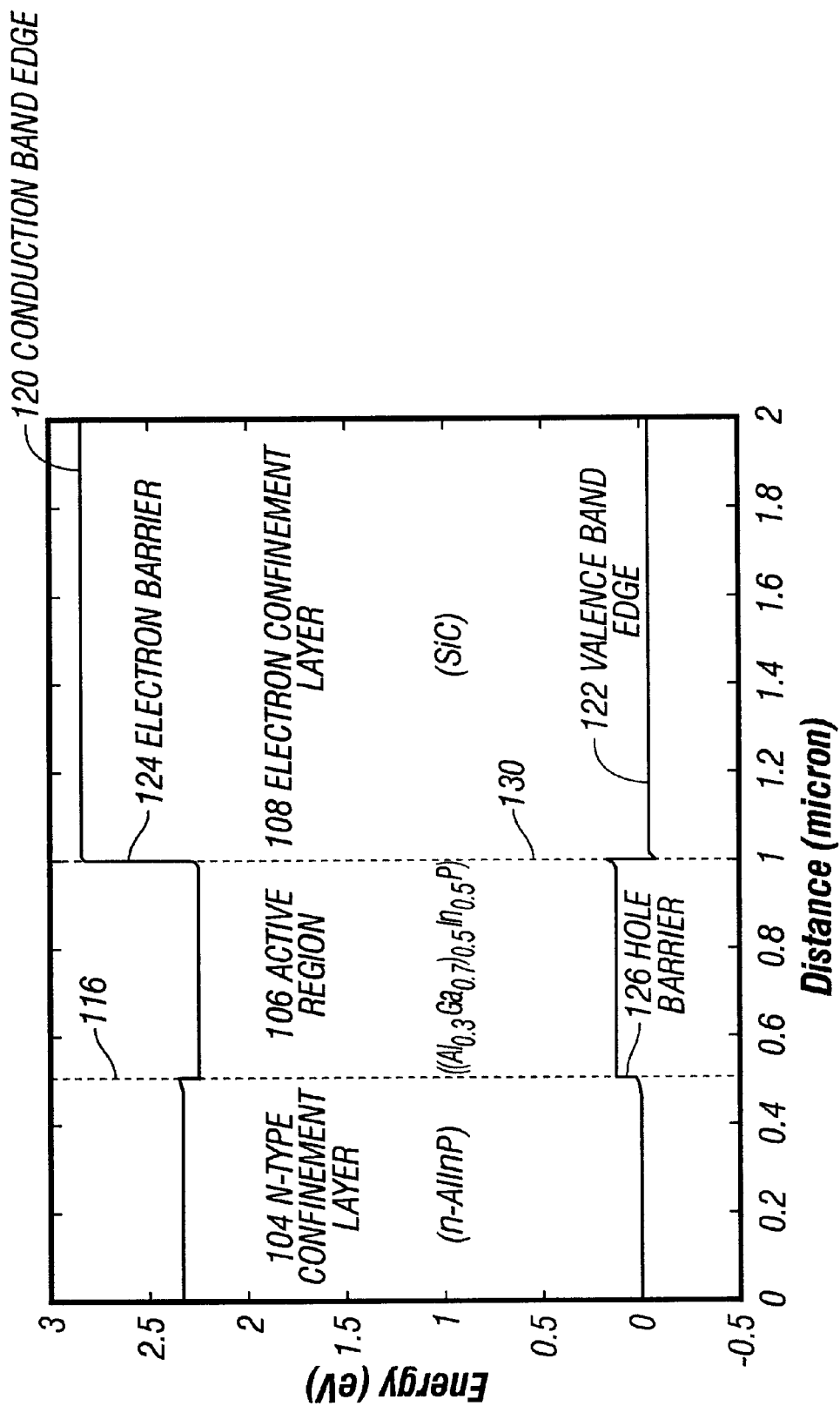
FIG. 4 is a schematic diagram of the electronic band structure in a portion of the LED of FIG. 3B in accordance with an embodiment of the present invention.

FIG. 4 shows a conventionally calculated band structure diagram of the heterostructure defined by active region 106 and confinement layers 104 and 108 of LED 101 in accordance with one embodiment of the present invention. Similarly to FIG. 2, the horizontal axis of FIG. 4 represents position in LED 101 measured perpendicular to active region 106 and confinement layers 104 and 108. In the example of FIG. 4, n-type confinement layer 104 is formed from n-type AlInP, electron confinement layer 108 is formed from p-type SiC, and active region 106 is formed from $(Al_{0.3}Ga_{0.7})_{0.5}In_{0.5}P$. The interface between confinement layer 104 and active region 106 is indicated by dashed line 116, and the wafer bonded interface between active region 106 and confinement layer 108 is indicated by dashed line 130. Similarly to FIG. 2, the vertical axis of FIG. 4 represents the energy of the conduction band edge 120 and of the valence band edge 122 when confinement layers 104 and 108 and active region 106 are forward biased at about 2.1 volts. The energy of conduction band edge 120 is higher in SiC electron confinement layer 108 than in active region 106, resulting in an electron barrier 124 of about 0.6 eV at wafer-bonded interface 130. One of ordinary skill in the art will recognize that the magnitude of this barrier is affected by the acceptor concentration in SiC electron confinement layer 108. Similarly, the energy of valence band edge 122 is higher in active region 106 than in n-type confinement layer 104, resulting in a hole barrier 126 at interface 116.

Figure 1:
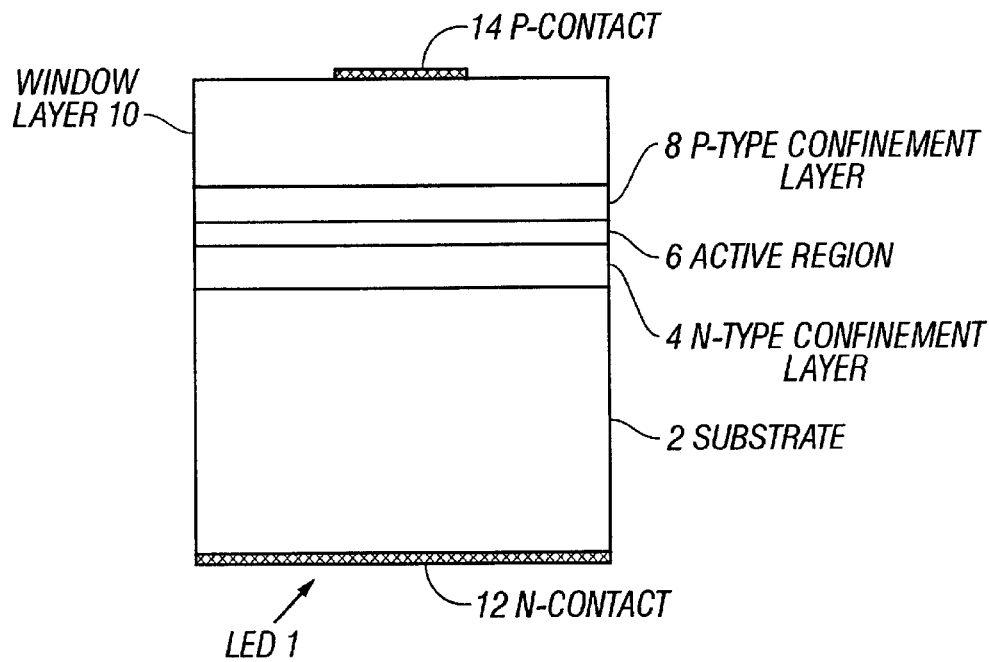
FIG. 1 is a schematic diagram of a conventional $Al_xGa_y$-$In_zP$ LED.

Electron barrier 124 associated with the wafer bonded interface of a SiC electron confinement layer 108 and active region 106 in LED 101, formed in accordance with this embodiment, is substantially larger than electron barrier 24 associated with the interface of active region 6 and p-type confinement layer 8 in conventional LED 1 of FIG. 1. Consequently, electrons are more effectively confined to active region 106 in LED 101, formed in accordance with this embodiment, than to active region 6 of conventional LED 1.

This enhanced electron confinement imparts numerous advantages to heterostructures and light emitting devices formed in accordance with this embodiment of the present invention. For example, the enhanced confinement due to wafer bonded SiC electron confinement layer 108 results in an increased electron concentration in active region 106, due to reduced thermionic emission of electrons, and thus a higher rate of radiative recombination of electrons and holes in active region 106. Hence, the internal quantum efficiency of an $Al_xGa_yIn_zP$ LED formed in accordance with this embodiment is increased compared to a conventional $Al_xGa_yIn_zP$ LED, particularly at short emission wavelengths.

In addition, the internal quantum efficiency of an $Al_xGa_yIn_zP$ LED formed in accordance with this embodiment exhibits improved temperature dependence compared to that of a conventional $Al_xGa_yIn_zP$ LED. The internal quantum efficiency of a conventional $Al_xGa_yIn_zP$ LED typically declines by a factor of two or more as its temperature is raised from about 25° C. to about 100° C. This decline is due to an increased rate of thermionic emission over the relatively low energy electron barrier in such a conventional LED. As a result of enhanced electron confinement, the internal quantum efficiency of an $Al_xGa_yIn_zP$ LED formed in accordance with this embodiment is much less sensitive to temperature. Thus, an $Al_xGa_yIn_zP$ LED formed in accordance with this embodiment can be operated at higher current densities (which generate higher temperatures), and thus at higher output powers, than such a conventional LED.

Moreover, the active region in a conventional $Al_xGa_yIn_zP$ LED must be sufficiently thick to reduce electron leakage to a tolerable level. In a conventional $Al_xGa_yIn_zP$ LED emitting light at wavelengths less than about 600 nm, for example, the active region is typically at least 500 Å thick, more typically about 2 µm thick. The enhanced electron confinement in an $Al_xGa_yIn_zP$ LED formed in accordance with this embodiment of the present invention relaxes this restriction. Consequently, the thickness of active region 106 in this embodiment can be optimized to further increase the internal quantum efficiency of LED 101.

The advantages of this embodiment are achieved by wafer bonding a SiC electron confinement layer 108 to an $(Al_xGa_{1-x})_{0.5}In_{0.5}P$ active region 106. It should be noted that it would be very difficult to provide such a SiC electron confinement layer by conventional epitaxial growth processes, since SiC cannot be lattice matched to the $Al_xGa_yIn_zP$ system. Moreover, such a growth process would damage underlying layers in the LED.

In other embodiments, electron confinement layer 108 is formed by wafer bonding a layer 128 of a material other than SiC to active region 106. Preferably, the material from which electron confinement layer 108 is formed has an electronic structure with a conduction band edge at a higher energy than the conduction band edge of the active region 106, and a valence band edge at an energy about equal to or less than the valence band edge of the active region 106. Such conduction and valence band edge alignments provide at wafer bonded interface 130 a barrier to diffusion of electrons from active region 106 into electron confinement layer 108 (electron barrier 124) without introducing at wafer bonded interface 130 a significant barrier to injection of holes from electron confinement layer 108 into active region 106. In addition, preferably the material from which wafer bonded electron confinement layer 108 is formed can be doped to p-type conductivity, can be wafer bonded to active region 106 at a temperature less than about 1000° C. to form a wafer bonded interface of relatively low electrical resistance ($\leq 0.1$ Ohms/cm$^2$, preferably $\leq 0.001$ Ohms/cm$^2$), and forms a similarly low resistance electrical contact with p-contact 114. In addition to SiC, materials which may satisfy the above requirements for electron confinement layer 108 include, but are not limited to, AlP, AlN, GaN, II–VI semiconductors such as CdSe, CdS, ZnSe, ZnS, and diamond. Embodiments employing materials which satisfy the above requirements in wafer bonded electron confinement layer 108 provide advantages similar to those described above with respect to an embodiment employing a wafer bonded SiC electron confinement layer 108.

An additional advantage to the various embodiments of the present invention is that a relatively thick (greater than 200 µm, for example) wafer bonded electron confinement layer 108 can be formed in a rapid and cost efficient manner. By contrast, epitaxial growth of a thick electron confinement layer, if possible, typically requires a long growth time and thus limits manufacturing throughput.

In an implementation in which wafer bonded electron confinement layer 108 is thinner than about 50 µm, it may be desirable to dispose another semiconductor layer between electron confinement layer 108 and p-contact 114 in order to facilitate formation of a low resistance electrical contact to p-contact 114 or to facilitate handling of layer 128 prior to wafer bonding. Preferably, this additional semiconductor layer is formed from a material that has a valence band edge at an energy about equal to or less than that of the valence band edge of electron confinement layer 108, and thus does not introduce a significant barrier to injection of holes into electron confinement layer 108 from p-contact 114.

The wafer bonding process described above may introduce defects into electron confinement layer 108 and active region 106. A fraction of these defects, which are limited in extent and localized at wafer bonded interface 130, provide electron and/or hole traps and thus serve as nonradiative recombination sites. At low current densities, these traps may reduce the internal quantum efficiency of an LED formed in accordance with an embodiment of the present invention. However, such traps are saturated at high current densities. In one implementation, the material from which wafer bonded electron confinement layer 108 is formed is chosen to minimize formation of such traps.

Figure 5A:
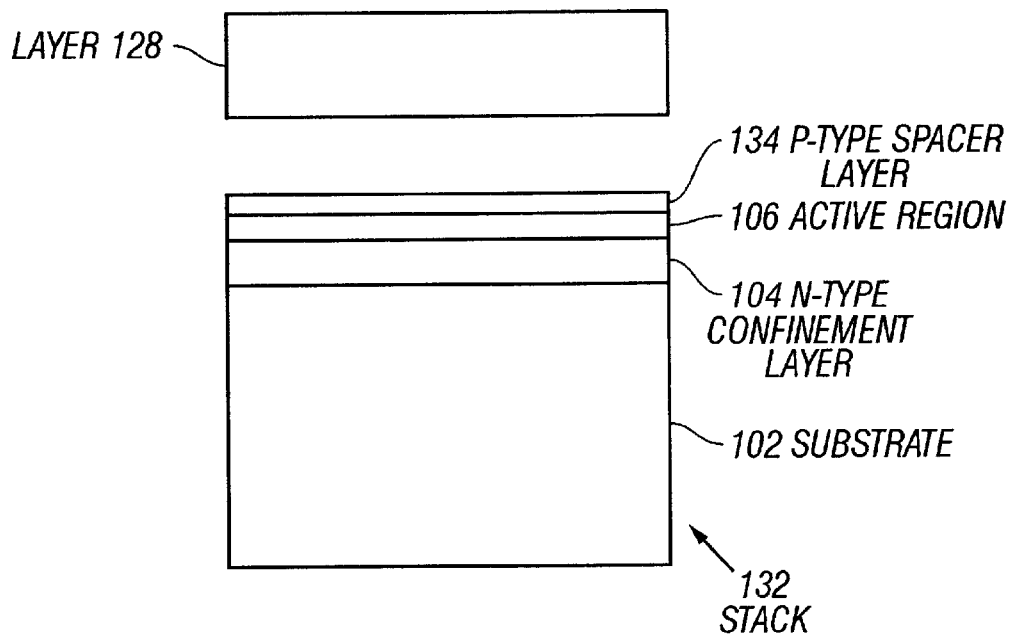
FIG. 5A is a schematic diagram of a layer and a stack including a p-type spacer layer to be wafer bonded to each other in accordance with another embodiment of the present invention.

The effect of defects associated with a wafer bonded interface on the performance of an LED may be reduced by spacing the interface from the active region. Referring to FIG. 5A, for example, in accordance with another embodiment of the present invention, a semiconductor layer 128 is to be wafer bonded to a stack 132 to form an electron confinement layer in a heterostructure suitable for use in a light emitting semiconductor device. As in previously described embodiments, semiconductor layer 128 is, in one implementation, a layer of p-type SiC. In the example of FIG. 5A, stack 132 includes substrate 102, n-type confinement layer 104, and active region 106 as previously described in reference to stack 100 shown in FIG. 3A. In addition, stack 132 also includes p-type spacer layer 134 grown on and latticed matched to active region 106 by, for example, MOCVD.

Layer 128 is bonded to stack 132, in a wafer bonding process substantially similar to that employed in the embodiments described above, by placing layer 128 in contact with p-type spacer layer 134, raising the temperature of layer 128 and stack 132, and pressing layer 128 and stack 132 together.

Figure 5B:
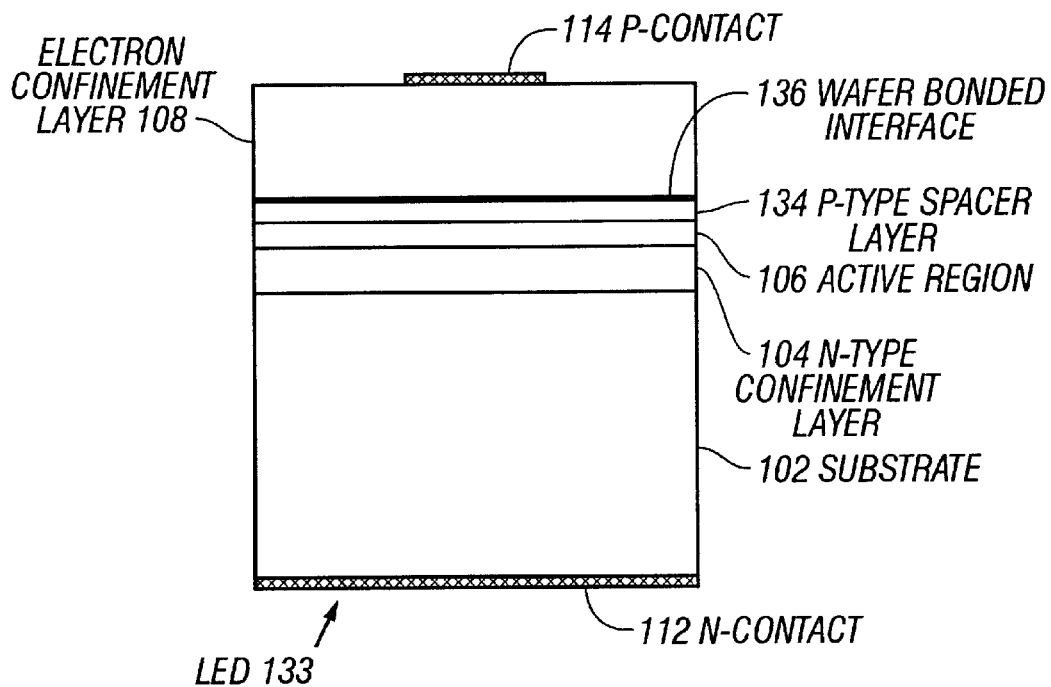
FIG. 5B is a schematic diagram of a light emitting diode including an electron confinement layer wafer bonded to a p-type spacer layer in accordance with an embodiment of the present invention.

Referring to FIG. 5B, a resulting LED 133 in accordance with an embodiment of the present invention includes substrate 102, n-type confinement layer 104, active region 106, and p-type spacer layer 134. LED 133 also includes electron confinement layer 108 formed by wafer bonding layer 128 to p-type spacer layer 134 at wafer bonded interface 136, and n-contact 112 and p-contact 114 electrically coupled to substrate 102 and electron confinement layer 108, respectively.

Although FIGS. 5A and 5B illustrate particular structures for stack 132 and LED 133, heterostructures and LEDs in accordance with the present invention may be implemented with variations in their structure and the composition of their layers as described above with respect to stack 100 and LED 101.

Preferably, the material from which p-type spacer layer 134 is formed has a conduction band edge at an energy about equal to or higher than the conduction band edge of active region 106, and a valence band edge at an energy intermediate between the valence band edge of active region 106 and the valence band edge of electron confinement layer 108. Such preferred conduction and valence band edge alignments avoid introducing a well in either the conduction band edge or the valence band edge at p-type spacer layer 134, and avoid introducing or reduce a hole barrier in the valence band edge at or near p-type spacer layer 134. However, shallow wells in the band edges and small hole barriers at or near p-type spacer layer 134 do not significantly degrade the performance of an LED 133 formed in accordance with an embodiment of the present invention. In addition, preferably the material from which p-type spacer layer 134 is formed can be doped to p-type conductivity, and can be wafer bonded to electron confinement layer 108 at a temperature less than about 1000° C. to form a wafer bonded interface of relatively low electrical resistance. In one implementation, the material from which p-type spacer layer 134 is formed is chosen to minimize formation of electron and hole traps at or near wafer bonded interface 136. Materials which may satisfy the above requirements for p-type spacer layer 134 include but are not limited to $(Al_xGa_{1-x})_{0.5}In_{0.5}P$ materials such as InGaP and AlInP.

Though spacing electron confinement layer 108 from active region 106 reduces the effect of electron and hole traps at wafer bonded interface 136 on the performance of an LED formed in accordance with an embodiment of the present invention, the electron confining effect of layer 108 decreases as the thickness of p-type spacer layer 134 increases. As a consequence, the thickness of p-type spacer layer 134 is preferably about equal to or less than an electron diffusion length in the material from which p-type spacer layer 134 is formed. One of ordinary skill in the art will recognize that an electron diffusion length in a given semiconductor material is approximately the average distance traveled by an electron in that material. The electron diffusion length in InGaP is, for example, 2 $\mu$m. Hence, p-type spacer layer 134 is typically less than about two $\mu$m thick.

Figure 6:
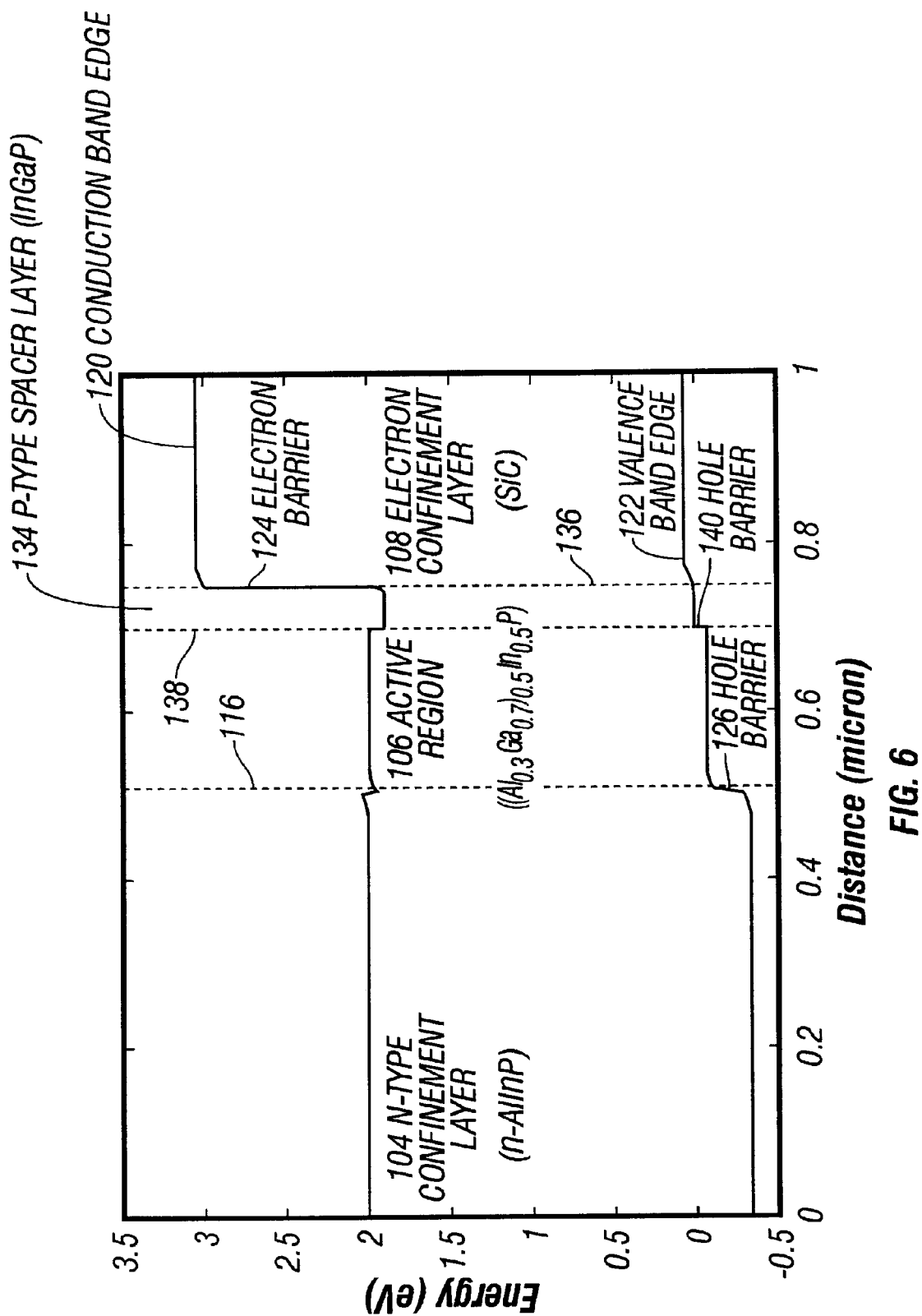
FIG. 6 is a schematic diagram of the electronic band structure in a portion of the LED of FIG. 5B including an InGaP p-type spacer layer in accordance with an embodiment of the present invention.

FIG. 6 shows a conventionally calculated band structure diagram of the heterostructure defined by n-type confinement layer 104, active region 106, p-type spacer layer 134, and electron confinement layer 108 of LED 133, in accordance with one embodiment of the present invention, under a forward bias of about 2.1 volts. In the example of FIG. 6, n-type confinement layer 104 is formed from n-type AlInP, active region 106 is formed from $(Al_{0.3}Ga_{0.7})_{0.5}In_{0.5}P$, p-type spacer layer 134 is formed from p-type InGaP, and electron confinement layer 108 is formed from p-type SiC. The interface between n-type confinement layer 104 and active region 106 is indicated by dashed line 116, the interface between active region 106 and p-type spacer layer 134 is indicated by dashed line 138, and the wafer bonded interface between p-type spacer layer 134 and electron confinement layer 108 is indicated by dashed line 130. It should be noted that SiC electron confinement layer 108 in the example of FIG. 6 has a higher acceptor concentration than SiC electron confinement layer 108 in the example of FIG. 4.

Figure 7:
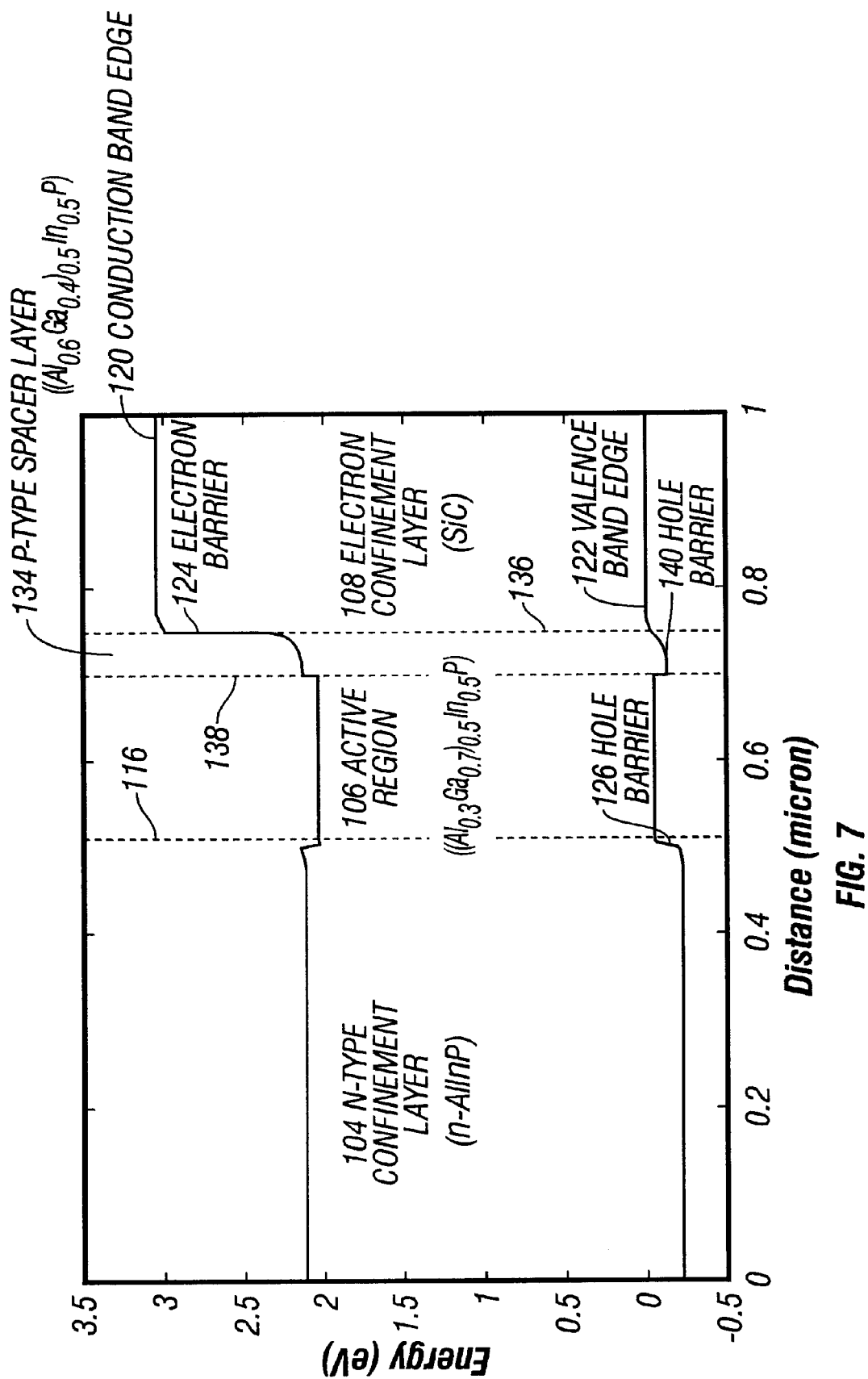
FIG. 7 is a schematic diagram of the electronic band structure in a portion of the LED of FIG. 5B including a $(Al_{0.6}Ga_{0.4})_{0.5}$InP p-type spacer layer in accordance with an embodiment of the present invention.
Figure 8:
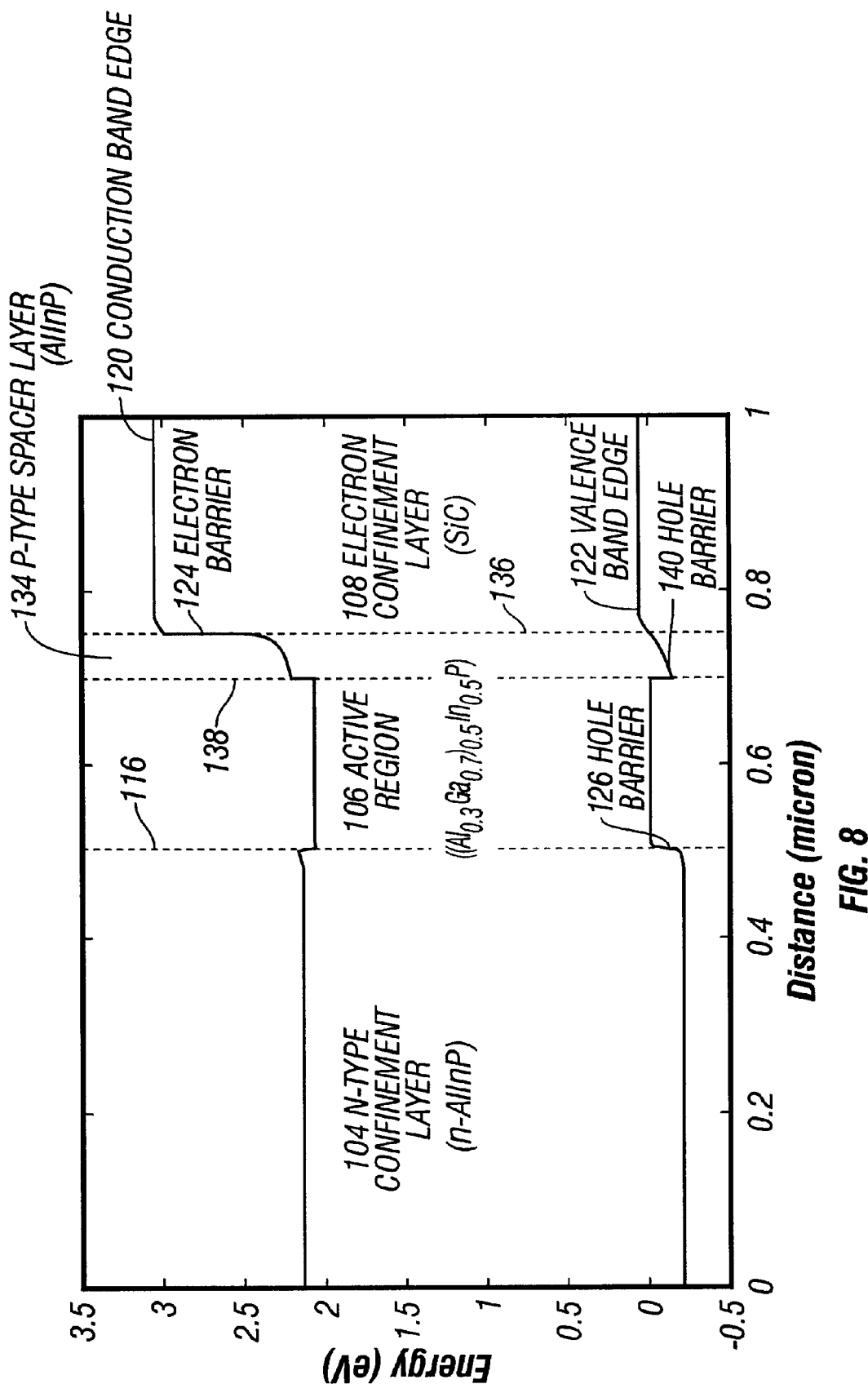
FIG. 8 is a schematic diagram of the electronic band structure in a portion of the LED of FIG. 5B including an AlInP p-type spacer layer in accordance with an embodiment of the present invention.

FIGS. 7 and 8 similarly show conventionally calculated band structure diagrams of the heterostructure defined by n-type confinement layer 104, active region 106, p-type spacer layer 134, and electron confinement layer 108 of LED 133, in accordance with other embodiments of the present invention, under a forward bias of about 2.1 volts. In the example of FIG. 7, p-type spacer layer 134 is formed from p-$(Al_{0.6}Ga_{0.4})_{0.5}In_{0.5}P$. In the example of FIG. 8, p-type spacer layer 134 is formed from p-AlInP. N-type confinement layer 104, active region 106, and electron confinement layer 108 are the same in the examples of FIGS. 7 and 8 as in the example of FIG. 6.

The examples of FIGS. 6, 7, and 8 all show a large electron barrier 124 which results in advantageously enhanced electron confinement in LED 133 formed in accordance with the corresponding embodiments. All three examples also show a small hole barrier 140 at or near wafer bonded interface 136.

In the example of FIG. 6, hole barrier 140 is only 0.13 eV. However the band gap in p-type spacer layer 134 formed from p-type InGaP is less than that of active region 106. Consequently, p-type spacer layer 134 of p-type InGaP absorbs a portion of the light emitted by active region 106, and re-emits light of longer wavelength. Such absorption is insignificant if p-type spacer layer 134 is sufficiently thin. Hence, in embodiments employing a p-type spacer layer 134 of p-type InGaP, the p-type spacer layer is preferably less than about 1 $\mu$m thick, more preferably less than about 100 Å thick. The thickness of such an absorbing spacer layer is typically chosen to optimize device performance, which is affected by absorption in the spacer layer, defects associated with the wafer bonded interface, and the dependence of the confining effect on the spacer layer thickness. One of ordinary skill in the art will recognize that aluminum in $Al_xGa_yIn_zP$ semiconductor materials, such as the $(Al_{0.3}Ga_{0.7})_{0.5}In_{0.5}P$ of active region 106 in the embodiments described above, can bind oxygen to form defects which serve as electron traps. The absence of aluminum in a p-type spacer layer 134 of p-type InGaP facilitates handling of stack 132, and advantageously reduces the number of electron traps at or near wafer bonded interface 136 in LED 133.

The examples of FIGS. 7 and 8 show hole barriers 140 of about 0.16 eV and about 0.19 eV, respectively. Both the p-type $(Al_{0.6}Ga_{0.7})_{0.5}In_{0.5}P$ spacer layer 134 of FIG. 7 and the p-AlInP spacer layer 134 of FIG. 8 have larger band gaps than active region 106 and are thus substantially transparent to light emitted from active region 106. However, both example spacer layers contain aluminum and thus bind oxygen to form electron traps.

Figure 9A:
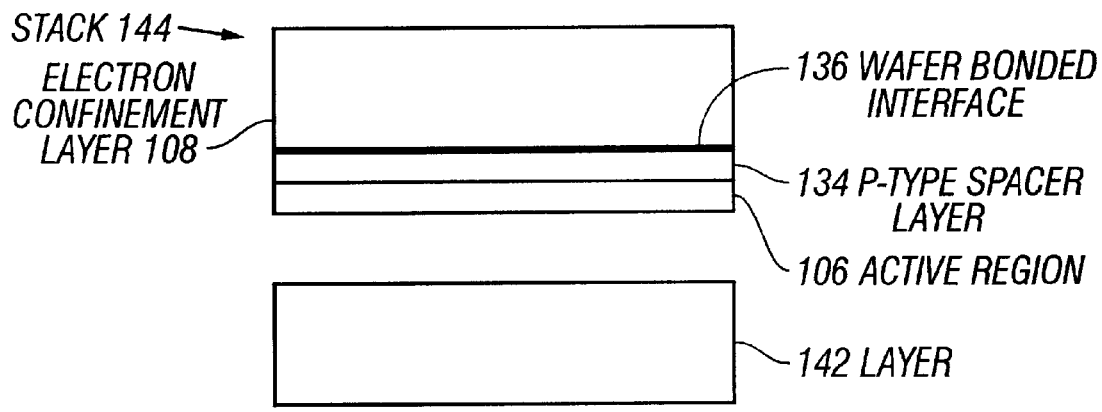
FIG. 9A is a schematic diagram of a layer and a stack including an electron confinement layer to be wafer bonded to each other in accordance with another embodiment of the present invention.

Referring to FIG. 9A, in accordance with another embodiment of the present invention, a semiconductor layer 142 is to be wafer bonded to a stack 144 to form an n-type confinement layer in a heterostructure suitable for use in a light emitting semiconductor device. Semiconductor layer 142 is, in one implementation, a layer of n-type AlP. In the example of FIG. 9A, stack 144 includes electron confinement layer 108, p-type spacer layer 134, and active region 106. Electron confinement layer 108 is wafer bonded to p-type spacer layer 134 at wafer bonded interface 136. In one implementation, wafer bonded electron confinement layer 108 is formed from p-type SiC and active region 106 includes one or more layers of $(Al_xGa_{1-x})_{0.5}In_{0.5}P$.

Stack 144 is formed in accordance with one embodiment by growing active region 106 on a sacrificial substrate, growing p-type spacer layer 134 on active region 106, wafer bonding electron confinement layer 108 to p-type spacer layer 134, and then removing the sacrificial substrate. In another embodiment, p-type spacer layer 134 is not present, and active region 106 is wafer bonded to electron confinement layer 108 prior to removal of the sacrificial substrate. In other embodiments, p-type spacer layer 134 is not present, both active region 106 and electron confinement layer 108 are formed by conventional growth techniques, and stack 144 does not include a wafer bonded interface. Stack 144 optionally includes a superstrate layer disposed above electron confinement layer 108.

Figure 9B:
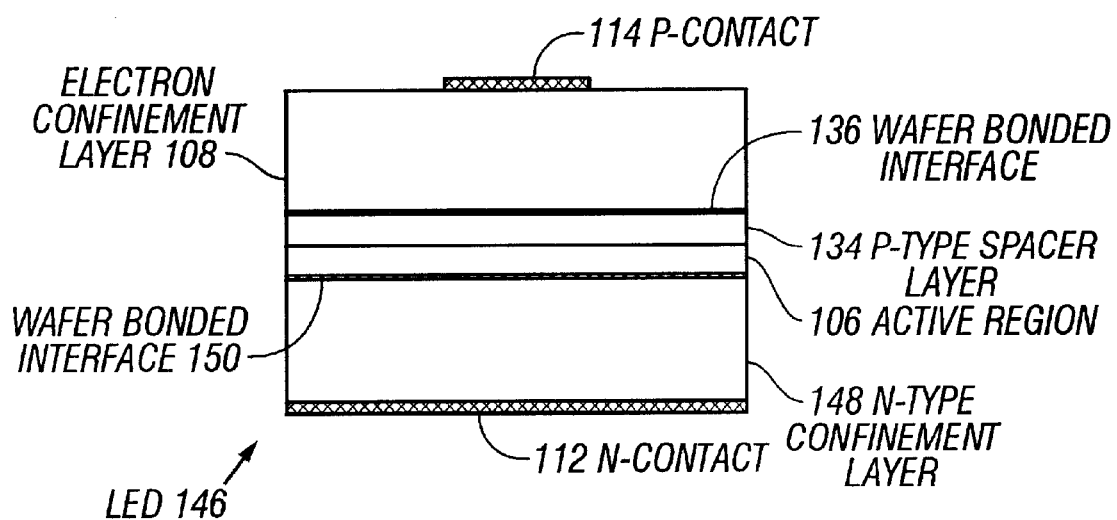
FIG. 9B is a schematic diagram of a light emitting diode including a wafer bonded n-type confinement layer in accordance with an embodiment of the present invention.

Layer 142 is bonded to stack 144 in a wafer bonding process substantially similar to that employed in the embodiments described above. Referring to FIG. 9B, a resulting LED 146 in accordance with an embodiment of the present invention includes n-type confinement layer 148 wafer bonded to active region 106 at wafer bonded interface 150, p-type spacer layer 134 disposed on active region 106, electron confinement layer 108 wafer bonded to p-type spacer layer 134 at wafer bonded interface 136, n-contact 112 electrically coupled to n-type confinement layer 148, and p-contact 114 electrically coupled to electron confinement layer 108. In other embodiments, LED 146 includes optional substrate and superstrate layers.

In one implementation, n-type confinement layer 148, and thus layer 142, are preferably greater than about 50 μm thick, more preferably greater than about 200 μm thick, in order to ease handling of layer 142 and to facilitate formation of a low resistance electrical contact between n-type confinement layer 148 and n-contact 112. In other implementations, n-type confinement layer 148, and thus layer 142, can be as thin as about 500 Angstroms (Å). In one implementation, layer 142 is initially thicker than a desired thickness of n-type confinement layer 148, and is thinned to the desired thickness after being wafer bonded to stack 144. Semiconductor layer 142 may be, for example, a wafer or block of semiconductor material, or a semiconductor layer on a stack of layers, such as an epitaxially grown semiconductor layer on a substrate. Semiconductor layer 142 may include a plurality of layers.

Figure 10:
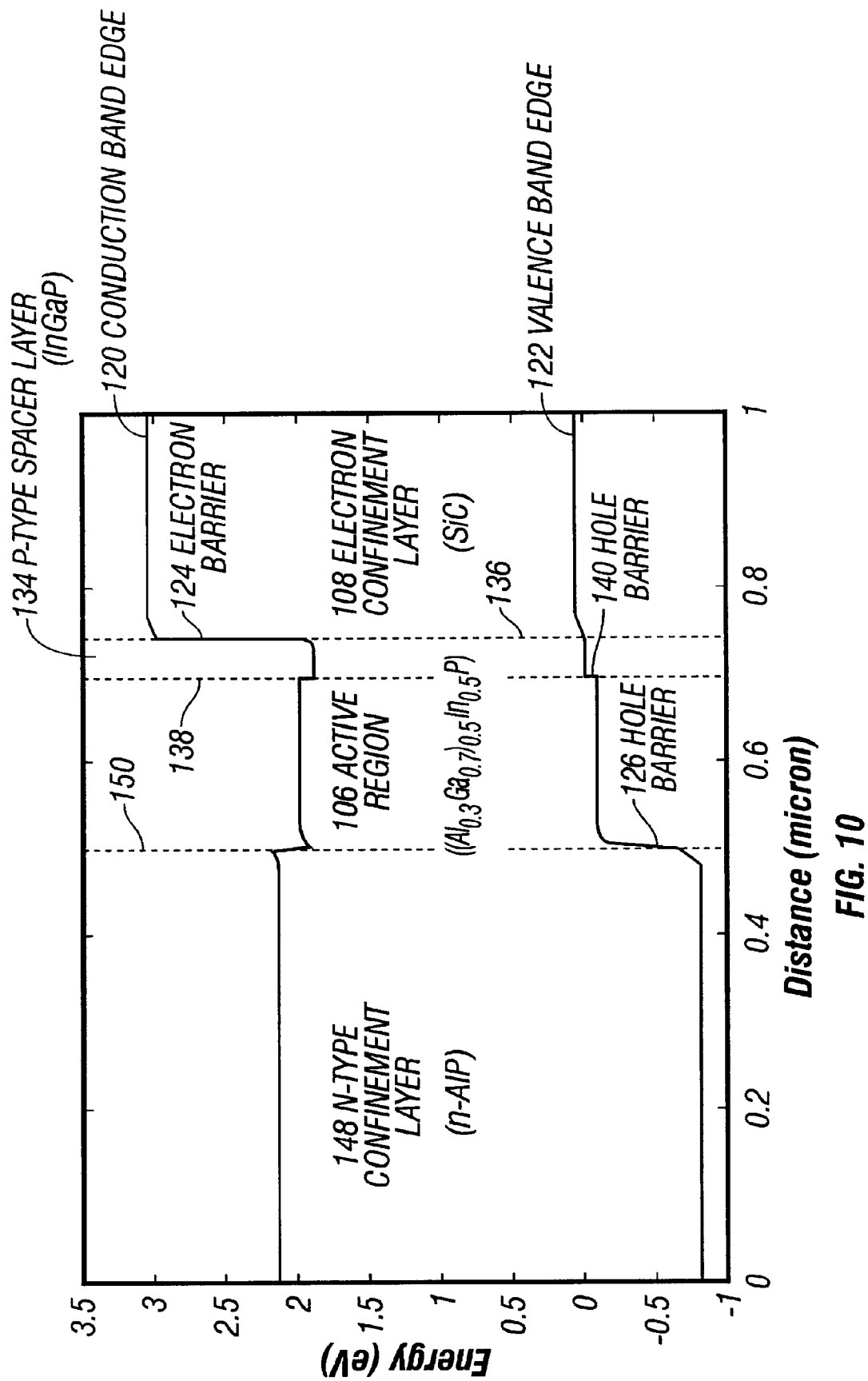
FIG. 10 is a schematic diagram of the electronic band structure in a portion of the LED of FIG. 9B in accordance with an embodiment of the present invention.

FIG. 10 shows a conventionally calculated band structure diagram for the heterostructure defined by n-type confinement layer 148, active region 106, p-type spacer layer 134, and electron confinement layer 108 of LED 146, in accordance with one embodiment of the present invention, under a forward bias of about 2.1 volts. In the example of FIG. 10, n-type confinement layer 148 is formed from n-type AlP, active region 106 is formed from $(Al_{0.3}Ga_{0.7})_{0.5}In_{0.5}P$, p-type spacer layer 134 is formed from p-type InGaP, and electron confinement layer 108 is formed from p-type SiC. The wafer bonded interface between n-type confinement layer 148 and active region 106 is indicated by dashed line 150, the interface between active region 106 and p-type spacer layer 134 is indicated by dashed line 138, and the wafer bonded interface between p-type spacer layer 134 and electron confinement layer 108 is indicated by dashed line 136.

Figure 2:
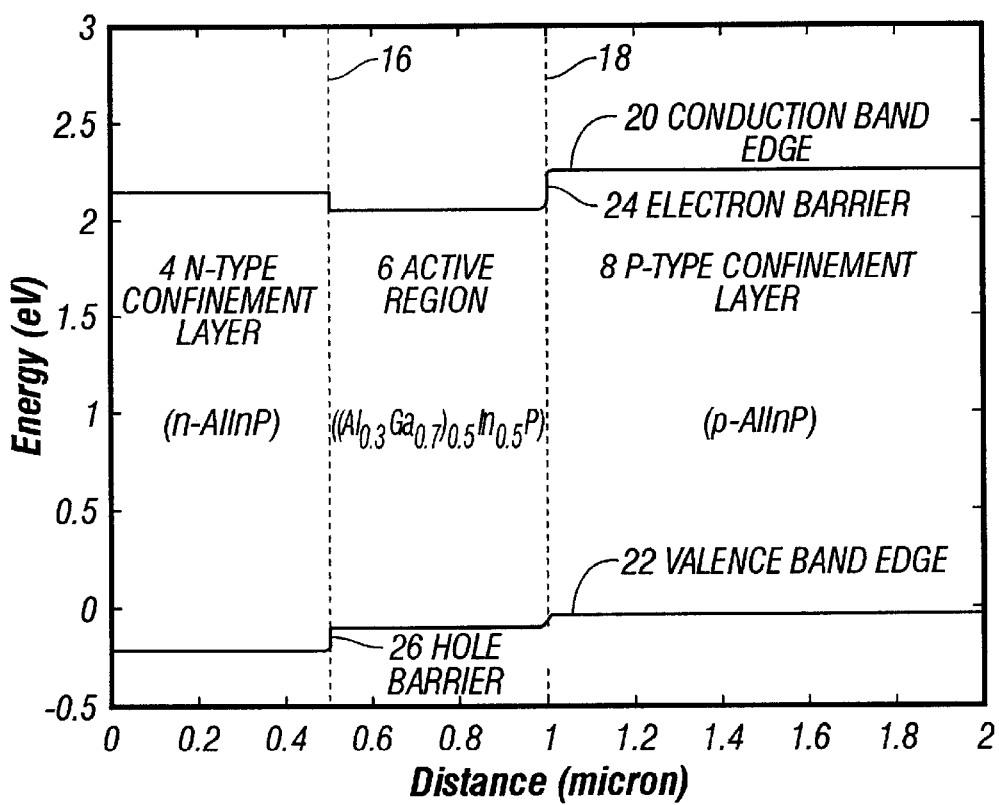
FIG. 2 is a schematic diagram of the band structure in a portion of the conventional $Al_xGa_yIn_zP$ LED of FIG. 1.

In the example of FIG. 10, hole barrier 126 of about 0.74 eV associated with the wafer bonded interface of n-AlP confinement layer 148 and active region 106 is substantially larger than hole barrier 26 of about 0.08 eV shown in the conventional example of FIG. 2. Consequently, holes are more effectively confined to active region 106 in LED 146, formed in accordance with an embodiment of the present invention, than to active region 6 of conventional LED 1. This enhanced hole confinement provides improved performance for an $Al_xGa_yIn_xP$ LED, in accordance with an embodiment of the present invention, operated at high injection currents or having a thin active region 106. Electron barrier 124 associated with wafer bonded interface 136 of p-type spacer layer 134 and electron confinement layer 108 provides advantageously enhanced electron confinement as noted above.

In other embodiments, n-type confinement layer 148 is formed by wafer bonding a layer 142 of a material other than AlP to active region 106. Preferably, the material from which n-type confinement layer 148 is formed has an electronic structure with a conduction band edge at an energy higher than that of the conduction band edge in active region 106, and a valence band edge at an energy less than that of the valence band edge in active region 106. Such conduction and valence band edge alignments provide at wafer bonded interface 150 a barrier 126 to diffusion of holes from active region 106 into n-type confinement layer 148 without introducing at wafer bonded interface 150 a significant barrier to injection of electrons into active region 106. In addition, preferably the material from which wafer bonded n-type confinement layer 148 is formed can be doped to n-type conductivity and can be wafer bonded to active region 106 at a temperature less than about 1000° C. to form a wafer bonded interface of relatively low electrical resistance and with relatively few defects. In addition to AlP, materials which may satisfy the above requirements for n-type confinement layer 148 include, but are not limited to, SiC, AlN, GaN, II–VI semiconductors such as CdSe, CdS, ZnSe, ZnS, and diamond.

Figure 11A:
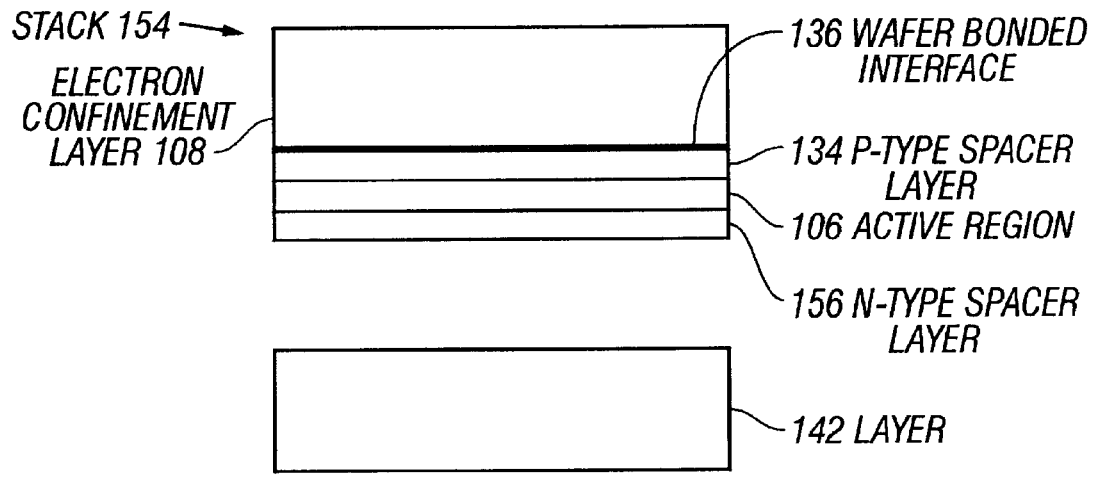
FIG. 11A is a schematic diagram of a layer and a stack including an n-type space layer to be wafer bonded to each other in accordance with an embodiment of the present invention.

The effect of defects associated with wafer bonded interface 150 on the performance of LED 146 may be reduced by spacing the wafer bonded interface from the active region. Referring to FIG. 11A, for example, in accordance with another embodiment a layer 142 is to be bonded to a stack 154 to form an n-type confinement layer in a heterostructure suitable for use in a light emitting semiconductor device. As in the previously described embodiment, layer 142 is, in one implementation, a layer of n-type AlP. In the example of FIG. 11A, stack 154 includes electron confinement layer 108 p-type spacer layer 134, active region 106, and n-type spacer layer 156. Electron confinement layer 108 is wafer bonded to p-type spacer layer 134 at wafer bonded interface 136. In one implementation, n-type spacer layer 156 is a layer of n-AlInP grown on and lattice matched to active region 106 by MOCVD, for example.

Figure 11B:
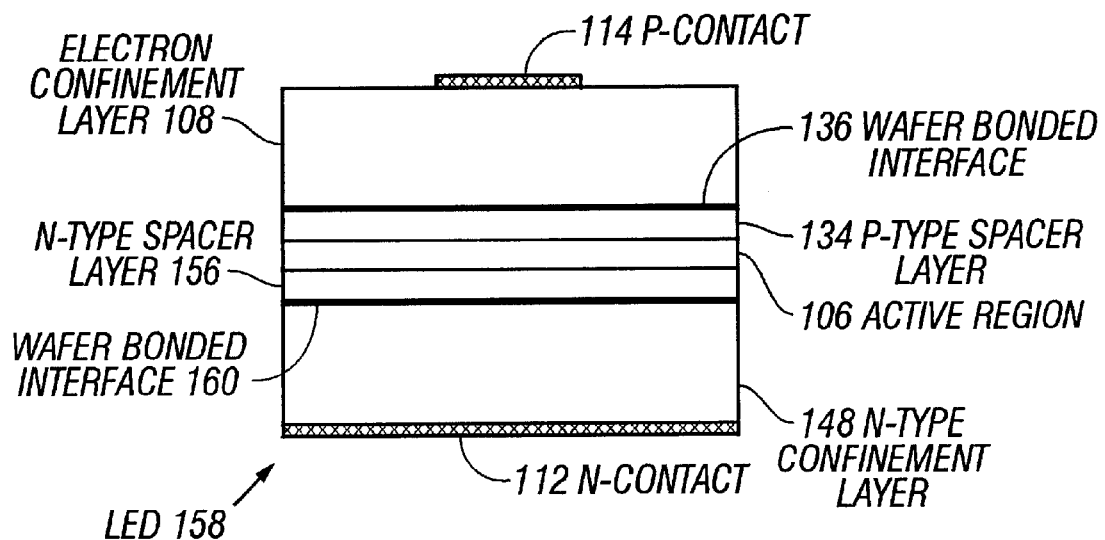
FIG. 11B is a schematic diagram of a light emitting diode including an n-type confinement layer wafer bonded to an n-type spacer layer in accordance with an embodiment of the present invention

Layer 142 is bonded to stack 154 in a wafer bonding process substantially similar to those described above. Referring to FIG. 11B, a resulting LED 158 in accordance with one embodiment includes n-type confinement layer 148 wafer bonded to n-type spacer layer 156 at wafer bonded interface 160, active region 106, p-type spacer layer 134 wafer bonded to electron confinement layer 108 at wafer bonded interface 136, n-contact 112 electrically coupled to n-type confinement layer 148, and p-contact 114 electrically coupled to electron confinement layer 108. In other embodiments, the structure and composition of stack 154 and LED 158 vary as described above with respect to stack 144 and LED 146, for example.

Preferably, the material from which n-type spacer layer 156 is formed has an electronic structure with a conduction band edge at an energy intermediate between that of the conduction band edge in n-type confinement layer 148 and active region 106, and a valence band edge at an energy about equal to or greater than that of active region 106. Such preferred conduction and valence band edge alignments avoid introducing a well in either the conduction band edge or the valence band edge, and avoid introducing or reduce an electron barrier in the conduction band edge at or near n-type spacer layer 156. In addition, preferably the material from which n-type spacer layer 156 is formed can be doped to n-type conductivity, and can be wafer bonded to n-type confinement layer 148 at a temperature less than about 1000° C. to form a wafer bonded interface of relatively low electrical resistance. In one implementation, the material from which n-type spacer layer 156 is formed is chosen to minimize formation of electron and hole traps at or near wafer bonded interface 160. In addition to AlInP, materials which may satisfy the above requirements for n-type spacer layer 156 include but are not limited to InGaP and other $(Al_xGa_{1-x})_{0.5}In_{0.5}P$ materials.

The thickness of n-type spacer layer 156 is preferably about equal to or less than a hole diffusion length in the material from which spacer layer 156 is formed. Hence, n-type spacer layer 156 is typically less than about 0.5 μm.

Figure 12:
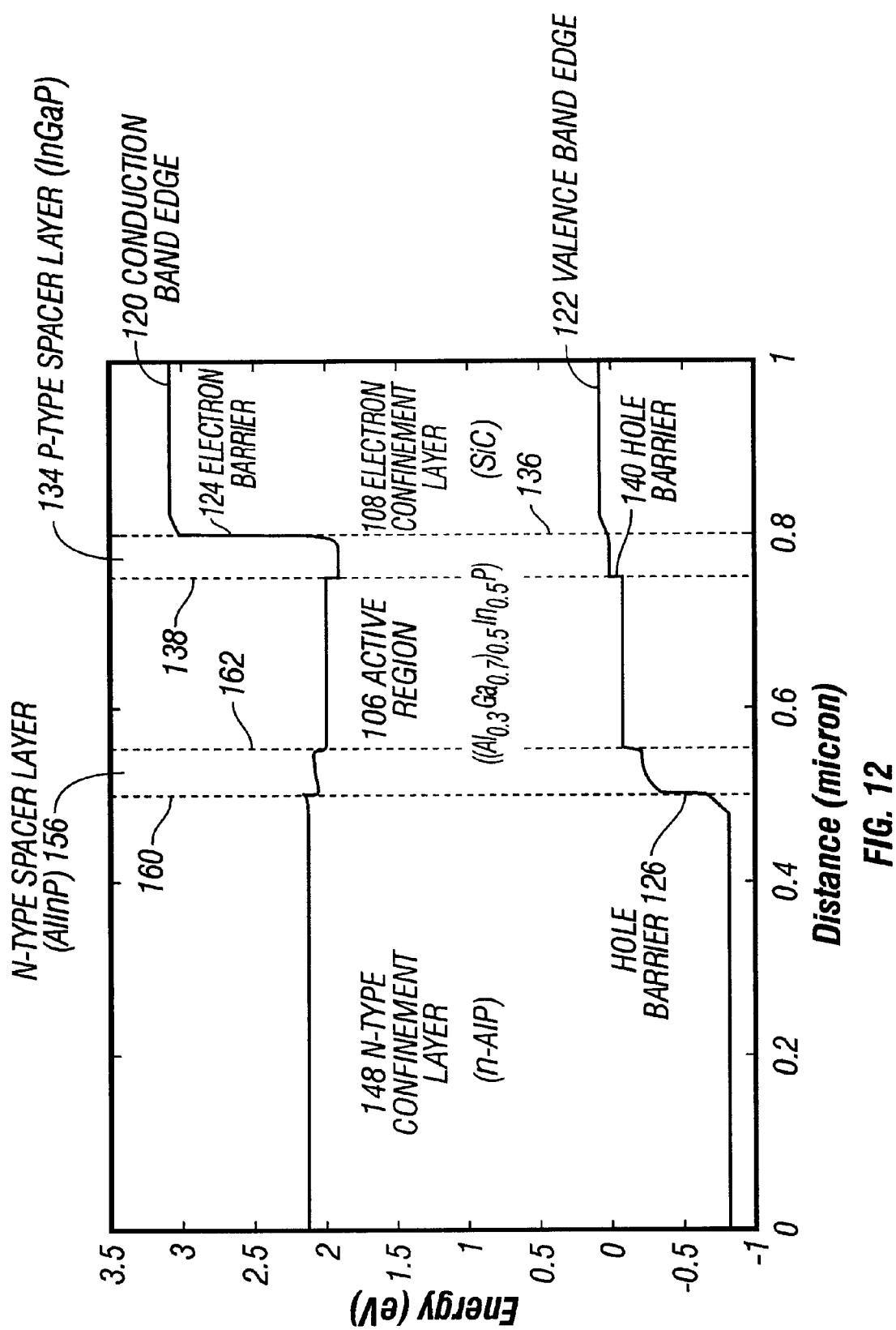
FIG. 12 is a schematic diagram of the electronic band structure in a portion of the LED of FIG. 11B including an AlInP n-type spacer layer in accordance with an embodiment of the present invention.

FIG. 12 shows a conventionally calculated band structure diagram for the heterostructure defined by n-type confinement layer 148, n-type spacer layer 156, active region 106, p-type spacer layer 134, and electron confinement layer 108 of LED 158, in accordance with one embodiment of the present invention, under a forward bias of about 2.1 volts. In the example of FIG. 12, n-type confinement layer 148 is formed from n-type AlP, n-type spacer layer 156 is formed from AlInP, active region 106 is formed from $(Al_{0.3}Ga_{0.7})_{0.5}In_{0.5}P$, p-type spacer layer 134 is formed from p-type InGaP, and electron confinement layer 108 is formed from p-type SiC. The wafer bonded interface between n-type confinement layer 148 and n-type spacer layer 156 is indicated by dashed line 160, the interface between n-type spacer layer 156 and active region 106 is indicated by dashed line 162, the interface between active region 106 and p-type spacer layer 134 is indicated by dashed line 138, and the wafer bonded interface between p-type spacer layer 134 and electron confinement layer 108 is indicated by dashed line 136.

In the example of FIG. 12, electron barrier 124 and hole barrier 126 provide advantageously enhanced carrier confinement as noted above. Hole barrier 140 does not significantly degrade the performance of LED 158.

In the examples of FIGS. 9A, 9B, 11A, and 11B, wafer bonded interfaces 136 and 156 are spaced from active region 106 by, respectively, spacer layers 134 and 156. In other embodiments, though, spacer layers disposed between active region 106 and carrier confinement layers are wafer bonded to active region 106. In the latter embodiments, the spacer layers, which space the confinement layers from active region 106, can improve the mechanical strength and electrical conductivity of the wafer bonded interfaces and prevent chemical reactions such as oxidation, for example, from occurring on surfaces of the confinement layers prior to the wafer bonding process.

Figure 13A:
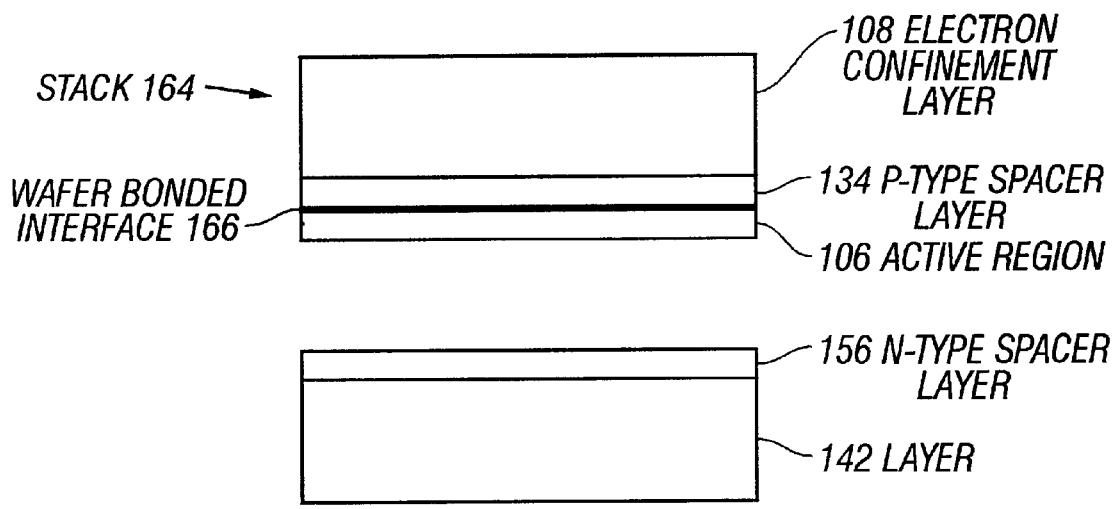
FIG. 13A is a schematic diagram of two stacks to be wafer bonded to each other in accordance with an embodiment of the present invention.

Referring to FIG. 13A, for example, in accordance with one embodiment n-type spacer layer 156 disposed on layer 142 is to be wafer bonded to a stack 164 to form an n-type spacer layer and an n-type confinement layer in a heterostructure. Stack 164 includes p-type spacer layer 134 disposed on electron confinement layer 108 and wafer bonded to active region 106 at wafer bonded interface 166. Spacer layers 156 and 134 may be grown on layer 142 and electron confinement layer 108, respectively, by MOCVD or MBE, for example. Active region 106 may be formed, for example, on a sacrificial substrate which is removed after active region 106 is wafer bonded to p-type spacer layer 134.

Figure 13B:
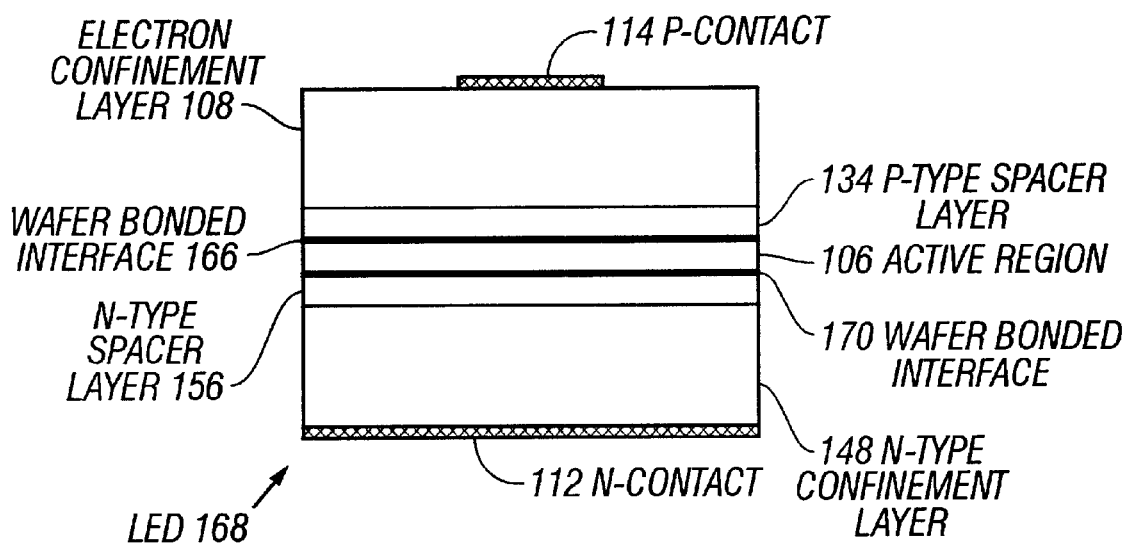
FIG. 13B is a schematic diagram of a light emitting diode including spacer layers disposed on confinement layers and wafer bonded to an active region in accordance with an embodiment of the present invention.

N-type spacer layer 156 is wafer bonded to active region 106 in a wafer bonding process substantially similar to those described above. Referring to FIG. 13B, a resulting LED 168 in accordance with one embodiment includes n-type spacer layer 156 disposed on n-type confinement layer 148 and wafer bonded to active region 106 at wafer bonded interface 170, p-type spacer layer 134 disposed on electron confinement layer 108 and wafer bonded to active region 106 at wafer bonded interface 166, and n-contact 112 and p-contact 114 electrically coupled to n-type confinement layer 148 and electron confinement layer 108, respectively.

The materials from which the various layers in stack 164 and LED 168 are formed are selected as described above with respect to other embodiments. Hence, LED 168 achieves advantages similar to those described for other embodiments. Also, though FIGS. 13A and 13B show both p-type spacer layer 134 and n-type spacer layer 156 wafer bonded to active region 106, in other implementations only one of spacer layers 134 and 156 is present, or both spacer layers 134 and 156 are present but only one is wafer bonded to active region 106.

Figure 14A:
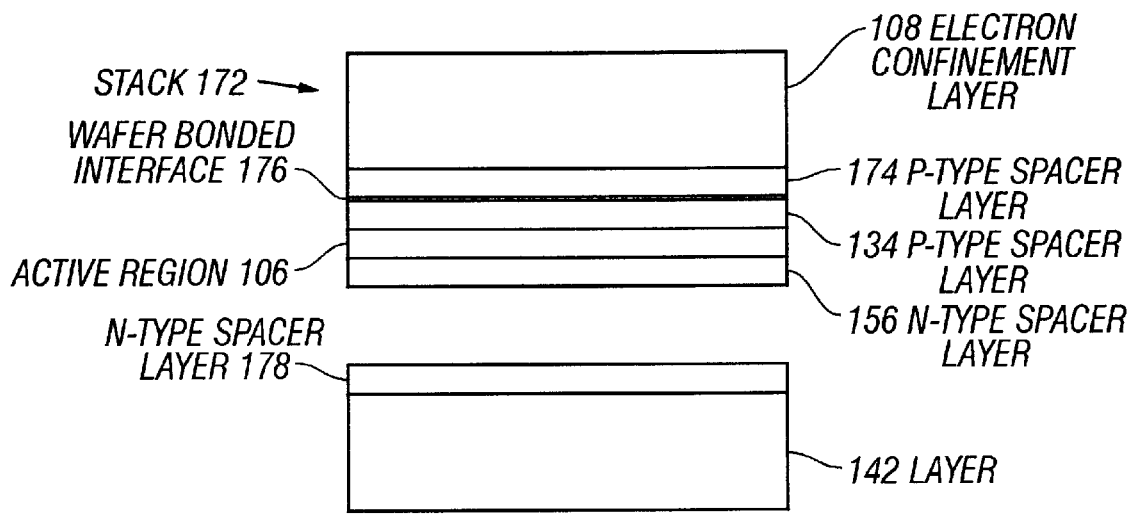
FIG. 14A is a schematic diagram of two stacks to be wafer bonded to each other in accordance with another embodiment of the present invention.

In other embodiments, spacer layers disposed on active region 106 are wafer bonded to spacer layers disposed on confinement layers. The use of two spacer layers wafer bonded to each other and disposed between active region 106 and a confinement layer can result in improved mechanical strength and electrical conductivity and prevent chemical reactions such as oxidation, for example, from occurring on the surface of the confinement layer prior to the wafer bonding process. Referring to FIG. 14A, for example, in accordance with one embodiment n-type spacer layer 178 disposed on layer 142 is to be wafer bonded to a stack 172 to form an n-type spacer layer and an n-type confinement layer in a heterostructure. Stack 172 includes p-type spacer layer 174 disposed on electron confinement layer 108, p-type spacer layer 134 wafer bonded to p-type spacer layer 174 at wafer bonded interface 176 and disposed on electron confinement layer 106, and n-type spacer layer 156 disposed on active region 106. Stack 172 may be formed by methods similar to those described for stack 164, for example.

Figure 14B:
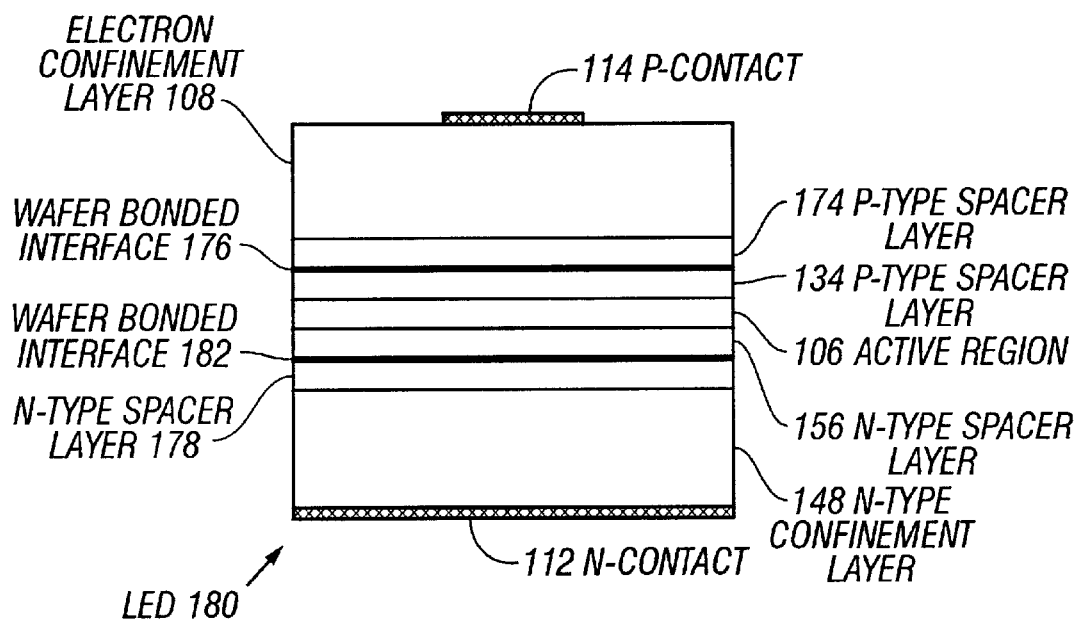
FIG. 14B is a schematic diagram of a light emitting diode including spacer layers wafer bonded to each other in accordance with an embodiment of the present invention.

N-type spacer layer 178 is wafer bonded to n-type spacer layer 156 in a wafer bonding process substantially similar to those described above. Referring to FIG. 14B, a resulting LED 180 in accordance with one embodiment includes n-type spacer layer 178 disposed on n-type confinement layer 148 and wafer bonded to n-type spacer layer 156 at wafer bonded interface 182, active region 106 disposed between n-type spacer layer 156 and p-type spacer layer 134, p-type spacer layer 176 wafer bonded to p-type spacer layer 134 at wafer bonded interface 176 and disposed on electron confinement layer 108, n-contact 112, and p-contact 114.

Though FIGS. 14A and 14B show both p-type spacer layer 174 and n-type spacer layer 178, in other implementations only one of spacer layers 174 and 178 is present. The total thickness of n-type spacer layers 156 and 178 is preferably less than about a hole diffusion length in the materials from which they are formed. Similarly, the total thickness of p-type spacer layers 134 and 174 is preferably less than about an electron diffusion length in the materials from which they are formed.

The materials from which the various layers in stack 172 and LED 180 are formed are selected similarly to as described above with respect to other embodiments. Two spacer layers wafer bonded to each other may be formed from the same material or from different materials. Preferably, the materials from which two p-type spacer layers wafer bonded to each other are formed are selected such that no significant barrier to injection of holes into active region 106 is produced at or near their interface. Similarly, the materials from which two n-type spacer layers wafer bonded to each other are formed are preferably selected such that no significant barrier to injection of electrons into active region 106 is produced at or near their interface. Hence, LED 180 achieves advantages similar to those described for other embodiments.

While the present invention is illustrated with particular embodiments, the invention is intended to include all variations and modifications falling within the scope of the appended claims. For example, spacer layers such as spacer layers 134, 156, 174, and 178 may each include a plurality of layers such as in superlattices. Moreover, though spacer layers are typically of the same conductivity type as the proximate confinement layer and have thus been labeled n-type and p-type in the various figures, in other implementations spacer layers 134, 156, 174, and 178 are undoped or doped oppositely to the proximate confinement layer. Conductivity through such undoped or oppositely doped spacer layers may occur through tunneling, for example. In addition, active regions of heterostructures and light emitting diodes may be formed in accordance with embodiments of the present invention from any compound semiconductor material system, including but not limited to II–VI materials and III–V materials such as $Al_xGa_yIn_zN$, $Al_xGa_yAs$, AlSb, and $In_xGa_yAs_zP$. In such embodiments, n-type and p-type wafer bonded confinement layers are formed from materials chosen, for example, to have band edge alignments providing suitable electron and hole barriers and may include, for example, AMP, SiC, AlN, GaN, II–VI semiconductors such as CdSe, CdS, ZnSe, ZnS, diamond, and alloys or mixtures thereof.

We claim:

1. A light emitting semiconductor device comprising:
a first carrier confinement layer of a first semiconductor having a first conductivity type;
an active region; and
a wafer bonded interface disposed between said active region and said first carrier confinement layer.

2. The light emitting semiconductor device of claim 1, wherein said active region comprises $Al_xGa_yIn_zP$ with $0 \leq x \leq 1$, $0 \leq y \leq 1$, $0 \leq z \leq 1$, and $x+y+z=1$.

3. The light emitting semiconductor device of claim 1, wherein said active region comprises $(Al_xGa_{1-x})_{0.5}In_{0.5}P$ with $0 \leq x \leq 1$.

4. The light emitting semiconductor device of claim 1, wherein said wafer bonded interface is an interface of said active region and said first carrier confinement layer.

5. The light emitting semiconductor device of claim 1, wherein said first semiconductor comprises a semiconductor selected from the group consisting of p-type SiC, p-type AlP, p-type AlN, p-type GaN, p-type II–VI semiconductors, and p-type diamond.

6. The light emitting semiconductor device of claim 5, further comprising a second carrier confinement layer comprising n-type $Al_xGa_yIn_zP$ with $0 \leq x \leq 1$, $0 \leq y \leq 1$, $0 \leq z \leq 1$, and $x+y+z=1$, wherein said active region is disposed between said first carrier confinement layer and said second carrier confinement layer.

7. The light emitting semiconductor device of claim 1, wherein said first semiconductor comprises a semiconductor selected from the group consisting of n-type SiC, n-type AlP, n-type AlN, n-type GaN, n-type II–VI semiconductors, and n-type diamond.

8. The light emitting semiconductor device of claim 7, further comprising a second carrier confinement layer comprising a semiconductor selected from the group consisting of p-type $Al_xGa_yIn_zP$ with $0 \leq x \leq 1$, $0 \leq y \leq 1$, $0 \leq z \leq 1$, and $x+y+z=1$, p-type SiC, p-type AlN, p-type GaN, p-type II–VI semiconductors, and p-type diamond, wherein said active region is disposed between said first carrier confinement layer and said second carrier confinement layer.

9. The light emitting semiconductor device of claim 1, further comprising a first spacer layer disposed between said active region and said first carrier confinement layer.

10. The light emitting semiconductor device of claim 9, wherein said first spacer layer comprises $Al_xGa_yIn_zP$ with $0 \leq x \leq 1$, $0 \leq y \leq 1$, $0 \leq z \leq 1$, and $x+y+z=1$.

11. The light emitting semiconductor device of claim 9, wherein said first spacer layer comprises $(Al_xGa_{1-x})_{0.5}In_{0.5}P$ with $0 \leq x \leq 1$.

12. The light emitting semiconductor device of claim 9, wherein said first spacer layer comprises a material selected from the group consisting of p-type InGaP, p-type AlInP, and n-type AlInP.

13. The light emitting semiconductor device of claim 9, wherein said wafer bonded interface is an interface of said first spacer layer and said first carrier confinement layer.

14. The light emitting semiconductor device of claim 9, wherein said wafer bonded interface is an interface of said first spacer layer and said active region.

15. The light emitting semiconductor device of claim 9, further comprising a second spacer layer disposed between said active region and said first carrier confinement layer, wherein said wafer bonded interface is an interface of said first spacer layer and said second spacer layer.

16. The light emitting semiconductor device of claim 1, further comprising a second carrier confinement layer of a second semiconductor having a second conductivity type, wherein said active region is disposed between said first carrier confinement layer and said second carrier confinement layer.

17. The light emitting semiconductor device of claim 16, further comprising another wafer bonded interface disposed between said active region and said second carrier confinement layer.

18. The light emitting semiconductor device of claim 16, further comprising a first contact electrically coupled to said first carrier confinement layer and a second contact electrically coupled to said second carrier confinement layer.

19. A light emitting semiconductor device comprising:
a first semiconductor layer comprising n-type $(Al_{x1}Ga_{1-x1})_{0.5}In_{0.5}P$, wherein $0 \leq x2 \leq 1$;
a second semiconductor layer comprising a material selected from the group consisting of p-type SiC, p-type AlP, p-type AlN, and p-type GaN;
an active region comprising $(Al_{x2}Ga_{1-x2})_{0.5}In_{0.5}P$ disposed between said first semiconductor layer and said second semiconductor layer, wherein $0 \leq x2 \leq 1$;
a first contact electrically coupled to the first semiconductor layer;
a second contact electrically coupled to the second semiconductor layer; and
a wafer bonded interface disposed between said active region and said second semiconductor layer.

20. A light emitting semiconductor device comprising:
a first semiconductor layer of p-type conductivity;
a second semiconductor layer of n-type conductivity;
an active region disposed between said first semiconductor layer and said second semiconductor layer; and
a wafer bonded interface disposed between said active region and one of said first semiconductor layer and said second semiconductor layer;
wherein a conduction band edge of said first semiconductor layer is of higher energy than a conduction band edge of said active region, and a valence band edge of said second semiconductor layer is of lower energy than a valence band edge of said active region.

21. The light emitting semiconductor device of claim 20, wherein said active region comprises $Al_xGa_yIn_zP$ with $0 \leq x \leq 1$, $0 \leq y \leq 1$, $0 \leq z \leq 1$, and $x+y+z=1$.

22. The light emitting semiconductor device of claim 20, wherein said active region comprises $(Al_xGa_{1-x})_{0.5}In_{0.5}P$ with $0 \leq x \leq 1$.

23. The light emitting semiconductor device of claim 20, wherein said wafer bonded interface is one of an interface of said active region and said first semiconductor layer and an interface of said active region and said second semiconductor layer.

24. The light emitting semiconductor device of claim 20, wherein said wafer bonded interface is disposed between said active region and said first semiconductor layer, and said first semiconductor layer comprises a semiconductor selected from the group consisting of p-type SiC, p-type AlP, p-type AlN, p-type GaN, p-type II–VI semiconductors, and p-type diamond.

25. The light emitting semiconductor device of claim 20, wherein said wafer bonded interface is disposed between said active region and said second semiconductor layer, and said second semiconductor layer comprises a semiconductor selected from the group consisting of n-type SiC, n-type AlP, n-type AlN, n-type GaN, n-type II–VI semiconductors, and n-type diamond.

26. The light emitting semiconductor device of claim 20, further comprising a spacer layer disposed between said active region and said first semiconductor layer.

27. The light emitting semiconductor device of claim 26, wherein said spacer layer comprises an $Al_xGa_yIn_zP$ material with $0 \leq x \leq 1$, $0 \leq y \leq 1$, $0 \leq z \leq 1$, and $x+y+z=1$.

28. The light emitting semiconductor device of claim 20, further comprising a spacer layer disposed between said active region and said second semiconductor layer.

29. The light emitting semiconductor device of claim 28, wherein said spacer layer comprises an $Al_xGa_yIn_zP$ material with $0 \leq x \leq 1$, $0 \leq y \leq 1$, $0 \leq z \leq 1$, and $x+y+z=1$.

30. The light emitting semiconductor device of claim 20, where in said wafer bonded interface is disposed between said active region and said first semiconductor layer, further comprising another wafer bonded interface disposed between said active region and said second semiconductor layer.

31. The light emitting semiconductor device of claim 20, further comprising a p-contact electrically coupled to said first semiconductor layer and an n-contact electrically coupled to said second semiconductor layer.

* * * * *

UNITED STATES PATENT AND TRADEMARK OFFICE
CERTIFICATE OF CORRECTION

PATENT NO. : 6,525,335 B1
DATED : February 25, 2003
INVENTOR(S) : Michael R. Krames and Christopher P. Kocot It is certified that error appears in the above-identified patent and that said Letters Patent is hereby corrected as shown below:

Column 16,
Line 35, cancel "$0 \leq x2 \leq 1$" and substitute -- $0 \leq x1 \leq 1$ --.

Signed and Sealed this

Eighth Day of July, 2003

JAMES E. ROGAN
*Director of the United States Patent and Trademark Office*